(12) United States Patent
Tonar et al.

(10) Patent No.: US 8,899,761 B2
(45) Date of Patent: Dec. 2, 2014

(54) LENS CLEANING APPARATUS

(75) Inventors: William L. Tonar, Holland, MI (US);
Henry A. Luten, Holland, MI (US);
Danny L. Suman, Holland, MI (US);
Sandra Lynn Suman, legal representative, Holland, MI (US);
George A. Neuman, Holland, MI (US);
David J. Cammenga, Zeeland, MI (US);
Luke W. Koops, Zeeland, MI (US);
Danny L. Minikey, Jr., Fenwick, MI (US); Kristopher R. Green, Allendale, MI (US); Timothy L. Pawlowski, West Olive, MI (US)

(73) Assignee: Gentex Corporation, Zeeland, MI (US)

( * ) Notice: Subject to any disclaimer, the term of this patent is extended or adjusted under 35 U.S.C. 154(b) by 0 days.

(21) Appl. No.: 13/428,799

(22) Filed: Mar. 23, 2012

(65) Prior Publication Data
US 2012/0243093 A1 Sep. 27, 2012

Related U.S. Application Data

(60) Provisional application No. 61/511,749, filed on Jul. 26, 2011, provisional application No. 61/466,609, filed on Mar. 23, 2011.

(51) Int. Cl.
*B60R 1/06* (2006.01)
*H01L 41/09* (2006.01)
*G02B 27/00* (2006.01)

(52) U.S. Cl.
CPC ........ *G02B 27/0006* (2013.01); *H01L 41/0973* (2013.01)
USPC .......................................... 359/511; 359/509

(58) Field of Classification Search
CPC ...... B60R 2300/10–2300/108; G02B 27/0006; G02B 23/16
USPC ........... 359/507–512, 577–590; 396/427, 448
See application file for complete search history.

(56) References Cited

U.S. PATENT DOCUMENTS

| 1,153,945 A | 9/1915 | Mustin |
| 1,304,548 A | 5/1919 | De Normanville |

(Continued)

FOREIGN PATENT DOCUMENTS

| DE | 3638983 A1 | 5/1988 |
| JP | 57124238 A | 8/1982 |

(Continued)

OTHER PUBLICATIONS

The International Search Report and Written Opinion of The International Searching Authority, or The Declaration, Pages: All, Date: Jun. 28, 2012.

*Primary Examiner* — Stephone B Allen
*Assistant Examiner* — Kimberly N Kakalec
(74) *Attorney, Agent, or Firm* — Price Heneveld LLP; Scott P. Ryan

(57) ABSTRACT

A vibratory assembly having a housing. A transducer is operably coupled with the housing and has a substantially cylindrical shape. An isolator is at least partially disposed between the housing and the transducer. A lens cover is operably coupled with the transducer. A power source includes contacts operably coupled with the transducer. The power source supplies power to the transducer at various frequencies swept around a resonance harmonic to account for mass changes resulting from debris accumulation on the lens cover.

17 Claims, 20 Drawing Sheets

(56) References Cited

U.S. PATENT DOCUMENTS

| | | | | |
|---|---|---|---|---|
| 2,298,063 | A | 10/1942 | MacPherson | |
| 3,736,617 | A * | 6/1973 | Ahlen | 15/250.22 |
| 3,942,863 | A | 3/1976 | Schuwerk | |
| 4,187,868 | A | 2/1980 | Rudolphi | |
| 4,367,426 | A | 1/1983 | Kumada et al. | |
| 4,414,576 | A | 11/1983 | Randmae | |
| 4,701,659 | A | 10/1987 | Fujii et al. | |
| 4,768,256 | A | 9/1988 | Motoda | |
| 4,929,072 | A | 5/1990 | Fujie et al. | |
| 5,007,722 | A | 4/1991 | Mori et al. | |
| 5,012,593 | A | 5/1991 | Okada et al. | |
| 5,013,888 | A | 5/1991 | Okada et al. | |
| 5,025,187 | A | 6/1991 | Fujie et al. | |
| 5,068,770 | A | 11/1991 | Baziuk | |
| 5,132,840 | A | 7/1992 | Okada et al. | |
| 5,136,425 | A | 8/1992 | Fujie et al. | |
| 5,148,312 | A | 9/1992 | Kawai et al. | |
| 5,155,625 | A | 10/1992 | Komatsu et al. | |
| 5,166,825 | A | 11/1992 | Fujie et al. | |
| 5,170,288 | A | 12/1992 | Imaizumi et al. | |
| 5,172,024 | A | 12/1992 | Broussoux et al. | |
| 5,233,467 | A | 8/1993 | Ogasawara | |
| 5,299,060 | A | 3/1994 | Mori et al. | |
| 5,315,333 | A | 5/1994 | Nash | |
| 5,418,643 | A | 5/1995 | Ogasawara et al. | |
| 5,475,530 | A | 12/1995 | Fujie et al. | |
| 5,503,515 | A | 4/1996 | Moorehead | |
| 5,572,354 | A | 11/1996 | Desmond et al. | |
| 5,594,585 | A | 1/1997 | Komatsu | |
| 5,708,859 | A | 1/1998 | Tajima et al. | |
| 5,721,639 | A | 2/1998 | Aoshima et al. | |
| 5,724,186 | A | 3/1998 | Collier | |
| 6,145,984 | A * | 11/2000 | Farwig | 351/49 |
| 6,288,845 | B1 | 9/2001 | Harada | |
| 6,322,258 | B1 | 11/2001 | Ryan et al. | |
| 6,352,758 | B1 | 3/2002 | Huang et al. | |
| 6,524,664 | B1 * | 2/2003 | Hashimoto et al. | 427/558 |
| 6,587,573 | B1 | 7/2003 | Stam et al. | |
| 6,607,606 | B2 | 8/2003 | Bronson | |
| 6,648,477 | B2 | 11/2003 | Hutzel et al. | |
| 6,678,045 | B2 | 1/2004 | Rettig et al. | |
| 6,731,867 | B1 | 5/2004 | Sherwin | |
| 6,816,297 | B1 | 11/2004 | Tonar et al. | |
| 6,996,338 | B2 | 2/2006 | Sherwin | |
| 7,104,657 | B2 | 9/2006 | Sherwin | |
| 7,324,149 | B2 | 1/2008 | Takizawa et al. | |
| 7,486,326 | B2 | 2/2009 | Ito et al. | |
| 7,686,524 | B2 | 3/2010 | Takizawa et al. | |
| 7,881,496 | B2 | 2/2011 | Camilleri et al. | |
| 7,965,336 | B2 | 6/2011 | Bingle et al. | |
| 8,009,979 | B2 | 8/2011 | Shirono | |
| 8,011,837 | B2 | 9/2011 | Kawai | |
| 8,044,776 | B2 | 10/2011 | Schofield et al. | |
| 8,049,640 | B2 | 11/2011 | Uken et al. | |
| 8,075,143 | B2 * | 12/2011 | Fujimoto | 359/507 |
| 8,118,501 | B2 | 2/2012 | Buschmann | |
| 2002/0139394 | A1 | 10/2002 | Bronson | |
| 2003/0197909 | A1* | 10/2003 | Beyer et al. | 359/196 |
| 2003/0214588 | A1* | 11/2003 | Takizawa et al. | 348/207.99 |
| 2004/0183941 | A1 | 9/2004 | McCutchen | |
| 2004/0211892 | A1* | 10/2004 | Stallard et al. | 250/239 |
| 2006/0023131 | A1* | 2/2006 | Takano et al. | 349/12 |
| 2007/0007284 | A1 | 1/2007 | Veerasamy et al. | |
| 2007/0109441 | A1* | 5/2007 | Cheng | 348/373 |
| 2007/0132610 | A1* | 6/2007 | Guernalec et al. | 340/932.2 |
| 2007/0205674 | A1* | 9/2007 | Tseng et al. | 310/14 |
| 2007/0261711 | A1* | 11/2007 | Fagrenius et al. | 134/6 |
| 2008/0068520 | A1 | 3/2008 | Minikey, Jr. et al. | |
| 2009/0257123 | A1 | 10/2009 | Okazaki et al. | |
| 2010/0033818 | A1* | 2/2010 | Petcavich et al. | 359/507 |
| 2010/0034530 | A1* | 2/2010 | Son | 396/427 |
| 2010/0234489 | A1* | 9/2010 | Shimada et al. | 523/169 |
| 2010/0325825 | A1 | 12/2010 | Kawai | |
| 2011/0005030 | A1 | 1/2011 | Shirono | |
| 2011/0073142 | A1 | 3/2011 | Hattori et al. | |
| 2011/0120494 | A1 | 5/2011 | Ifuku et al. | |
| 2011/0187856 | A1* | 8/2011 | Lai | 348/143 |
| 2011/0228389 | A1 | 9/2011 | Ohashi | |
| 2011/0242667 | A1 | 10/2011 | Kulas et al. | |
| 2011/0249120 | A1 | 10/2011 | Bingle et al. | |
| 2011/0266375 | A1 | 11/2011 | Ono et al. | |
| 2011/0308381 | A1* | 12/2011 | Hartley | 89/36.02 |

FOREIGN PATENT DOCUMENTS

| | | |
|---|---|---|
| JP | 6310973 A | 11/1994 |
| JP | 8107327 A | 4/1996 |
| JP | 2004015604 A | 1/2004 |
| JP | 2007028195 A | 2/2007 |
| JP | 3941598 B2 | 7/2007 |

* cited by examiner

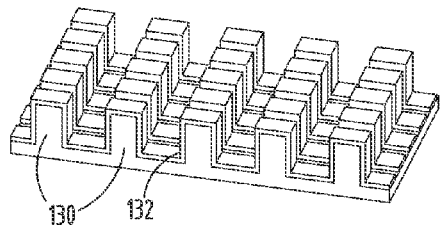 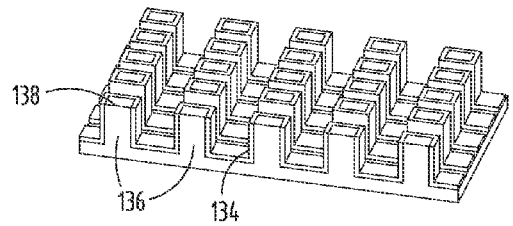
FIG. 26A   FIG. 26B
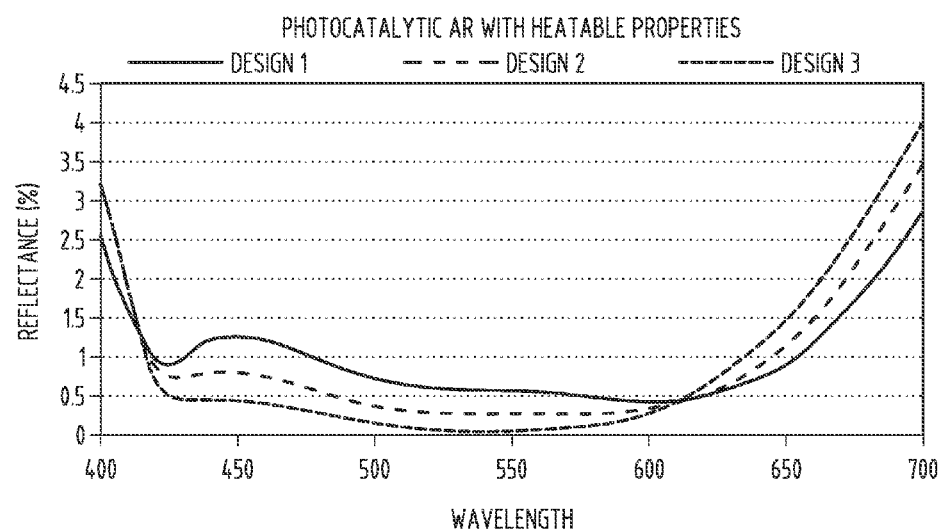
FIG. 27

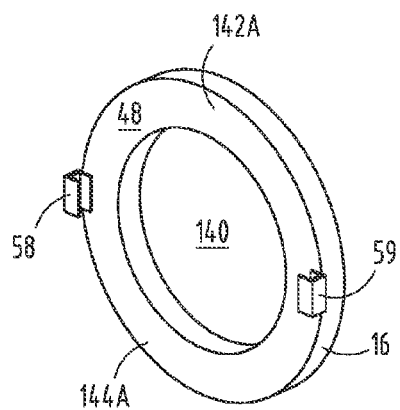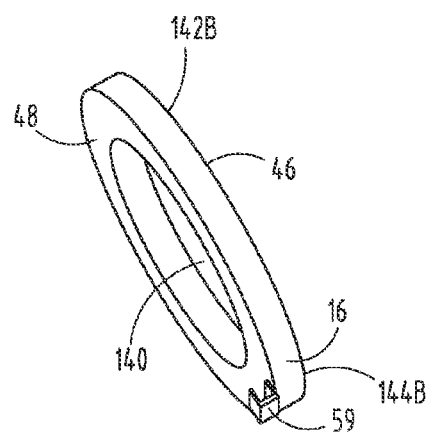
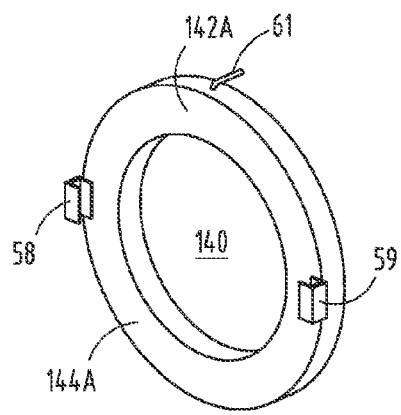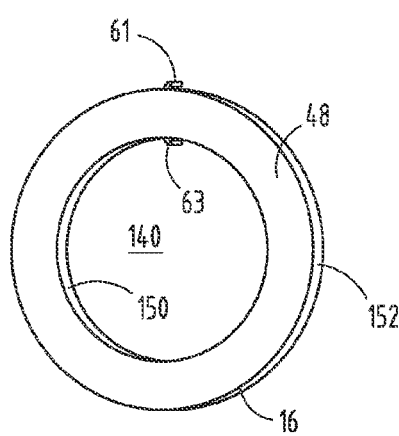
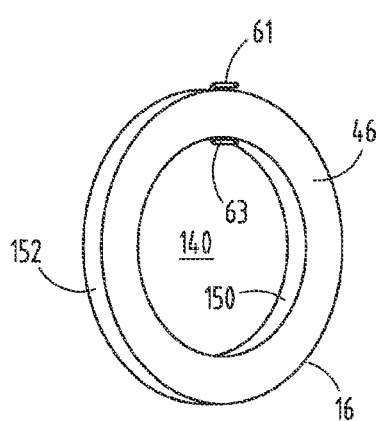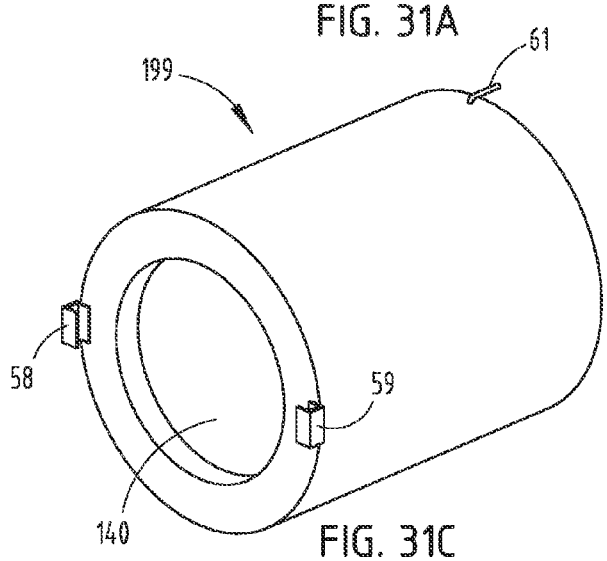

LENS CLEANING APPARATUS

CROSS-REFERENCE TO RELATED APPLICATION

This application claims the benefit of and priority to U.S. Provisional Patent Application No. 61/511,749, filed on Jul. 26, 2011, entitled "IMAGING DEVICE PROTECTOR AND CLEANER"; and 61/466,609, filed on Mar. 23, 2011, entitled "LENS CLEANING APPARATUS," the disclosures of which are hereby incorporated herein by reference in their entirety.

BACKGROUND OF THE INVENTION

The present invention generally relates to techniques that may be employed to keep camera lenses free of residual fluid and debris in an automotive environment.

SUMMARY OF THE INVENTION

One aspect of the present invention includes a vibratory assembly having a housing. A transducer is operably coupled with the housing and has a substantially cylindrical shape. An isolator is at least partially disposed between the housing and the transducer. A lens cover is operably coupled with the transducer. A power source includes contacts operably coupled with the transducer. The power source supplies power to the transducer at various frequencies swept around a resonance harmonic to account for mass changes resulting from debris accumulation on the lens cover.

Another aspect of the present invention includes a light sensing assembly for use on a vehicle having a light sensor device. A housing is disposed over the light sensor device. The housing includes a forward opening. A lens cover is disposed proximate the forward opening. A piezoelectric transducer is disposed between the housing and the lens cover. A power source is operably coupled with the piezoelectric transducer and the lens cover. The piezoelectric transducer is adapted to vibrate upon actuation of the power source. The power source supplies current through the lens cover to heat the lens cover.

Yet another aspect of the present invention includes a housing for a light sensor device having a wall structure that defines a receiving cavity and a forward opening. A lens cover is disposed over the forward opening. An isolator is disposed between the transducer and the housing. A vibratory assembly is operably coupled to the lens cover. A heater is operably coupled to the lens cover.

These and other aspects, objects, and features of the present invention will be understood and appreciated by those skilled in the art upon studying the following specification, claims, and appended drawings.

BRIEF DESCRIPTION OF THE DRAWINGS

In the drawings:

FIG. 26A is a top perspective view of another super hydrophobic surface of the present invention;

FIG. 26B is a top perspective view of a hybrid hydrophobic/hydrophilic surface of the present invention;

FIG. 27 is a graph illustrating reflectance versus wavelength for photocatalytic anti-reflectance materials;

FIG. 30A is a front elevational view of contacts on one embodiment of a transducer of the present invention;

FIG. 30B is a top elevational view of contacts on one embodiment of a transducer of the present invention;

FIG. 30C is a top perspective view of another embodiment of a transducer;

FIG. 31A is a front perspective view of contacts on one embodiment of a transducer of the present invention;

FIG. 31B is a rear perspective view of contacts of FIG. 31A;

FIG. 31C is a top perspective view of another embodiment of a transducer;

DETAILED DESCRIPTION OF EMBODIMENTS

Figure 2:
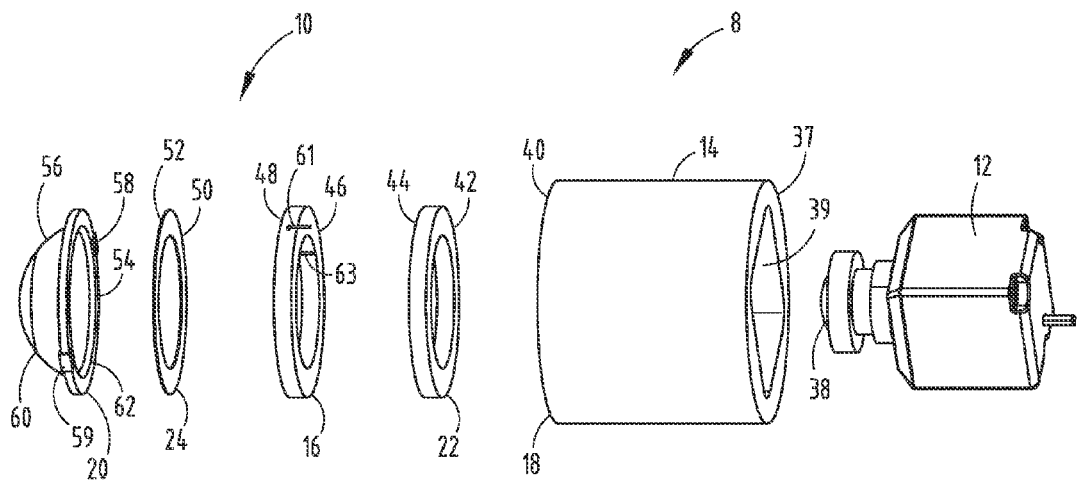
FIG. 2 is an exploded top perspective view of a piezoelectric system of the present invention.
Figure 3:
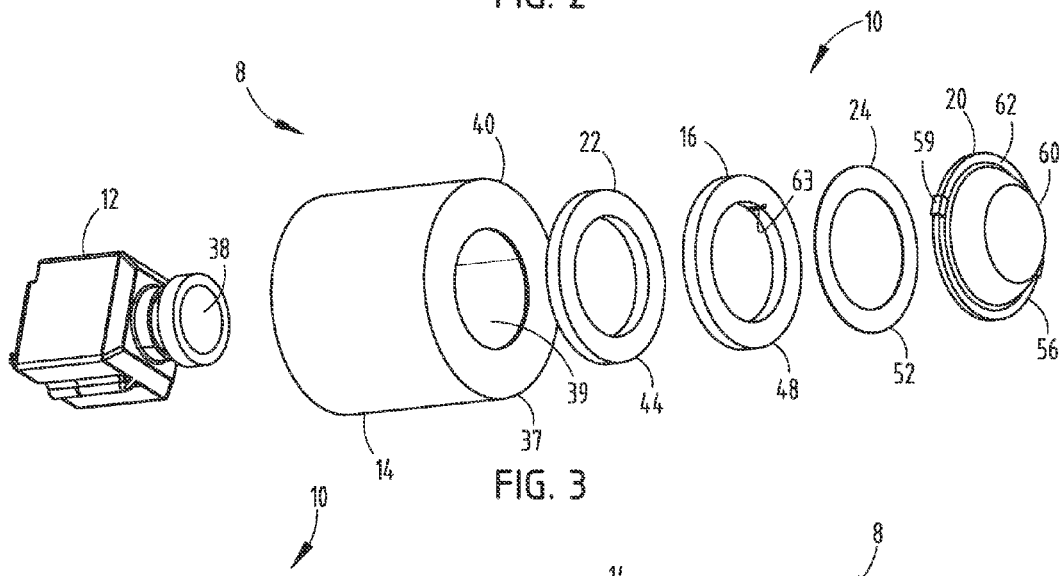
FIG. 3 is an exploded bottom perspective view of the piezoelectric system of FIG. 2.
Figure 4:
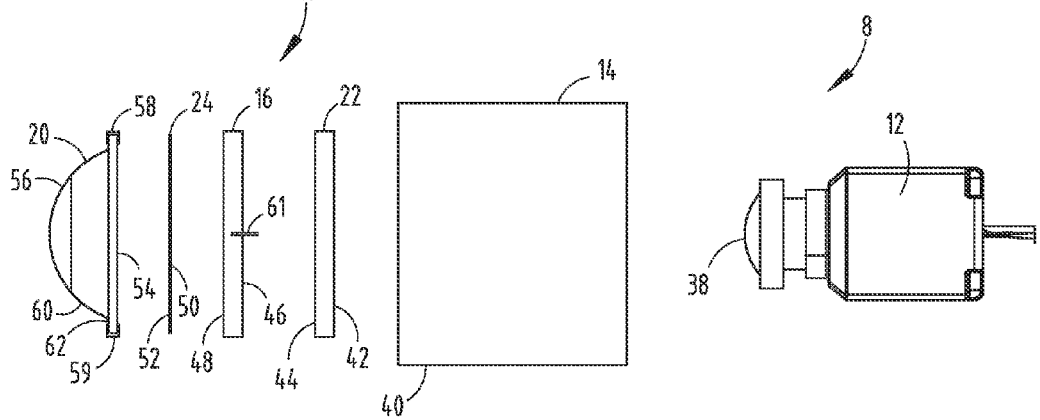
FIG. 4 is an exploded top plan view of the piezoelectric system of FIG. 2.
Figure 5:
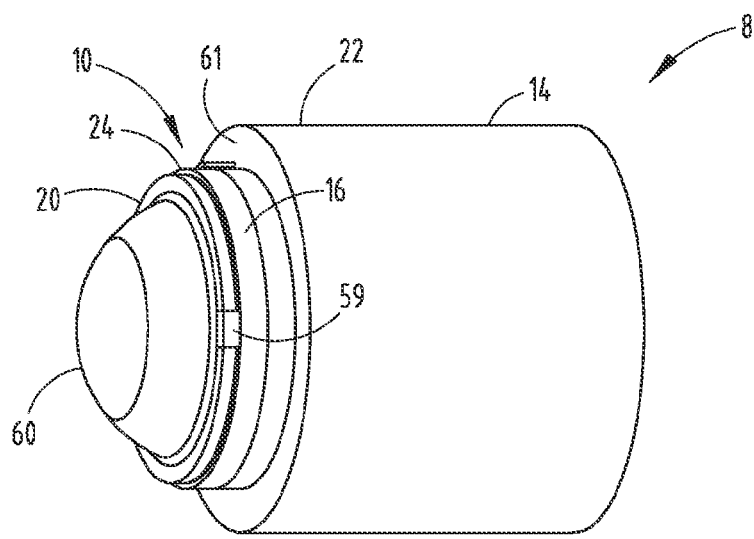
FIG. 5 is a side perspective view of an assembled piezoelectric system of the present invention.
Figure 6:
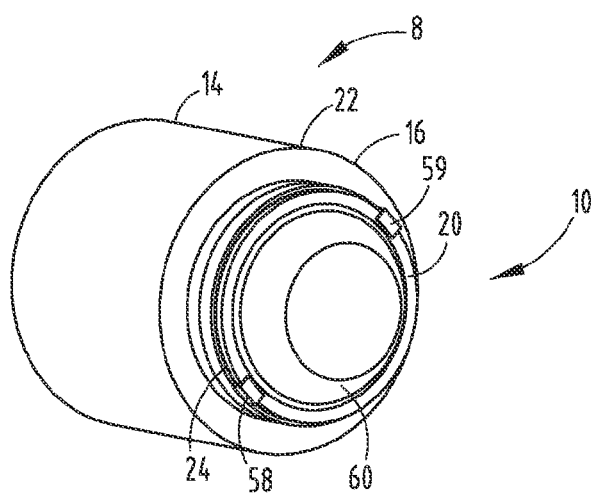
FIG. 6 is a front perspective view of the piezoelectric system of FIG. 5.
Figure 7:
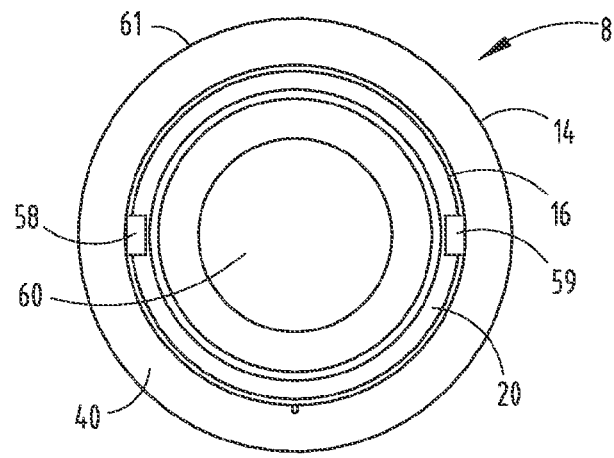
FIG. 7 is a front elevational view of the piezoelectric system of FIG. 5.

For purposes of description herein, the terms "upper," "lower," "right," "left," "rear," "front," "vertical," "horizontal," and derivatives thereof shall relate to the invention as oriented in FIGS. 2-4. However, it is to be understood that the invention may assume various alternative orientations and step sequences, except where expressly specified to the contrary. It is also, to be understood that the specific devices and processes illustrated in the attached drawings, and described in the following specification are exemplary embodiments of the inventive concepts defined in the appended claims. Hence, specific dimensions and other physical characteristics relating to the embodiments disclosed herein are not to be considered as limiting, unless the claims expressly state otherwise.

The present invention is generally directed to surface treatments and devices adapted to keep an optic member in a clean condition, or otherwise assist in the removal of fluid, frost, ice, snow, and debris from the optic member. The surface treatments and devices may include use of micro/nano-structures and mechanical devices including piezoelectrical devices, heaters, anti-reflective (AR), hydrophobic, super hydrophobic, conductive coatings, etc. It is also contemplated that one or more of the aforementioned cleaning methods or devices may be incorporated on a vehicle as a stand-alone feature, or in combination with one or more other features.

Piezoelectric Device

Referring to FIGS. 1A-5, the reference numeral 8 generally designates a vibratory assembly having a piezoelectric device 10 and a light sensor device 12. The piezoelectric device 10 includes a housing 14 adapted to support the light sensor device 12 therein. A piezoelectric transducer 16 is generally disposed proximate a forward end of the housing 14, and is operably coupled with a lens cover 20. An isolator 22 is disposed between the housing 14 and the piezoelectric transducer 16, and a connector 24 is disposed between the lens cover 20 and the piezoelectric transducer 16. It is understood that the piezoelectric transducer 16 could be smaller or larger than depicted in FIG. 8C. The piezoelectric transducer 16 could be a large cylindrical shape where the length is greater than the radius of the piezoelectric transducer 16, and set around the vibratory assembly 8 or both the vibratory assembly 8 and the light sensor device 12.

Figure 1A:
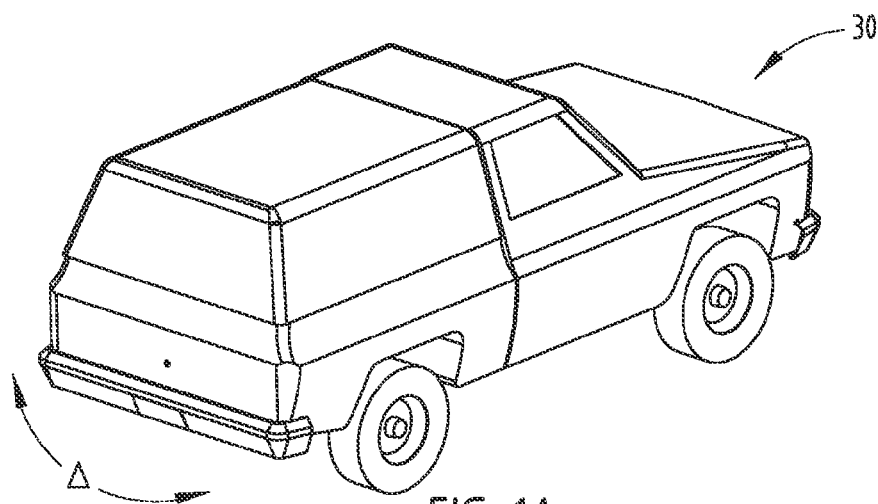
FIG. 1A is a side perspective view of a vehicle of the present invention.
Figure 1B:
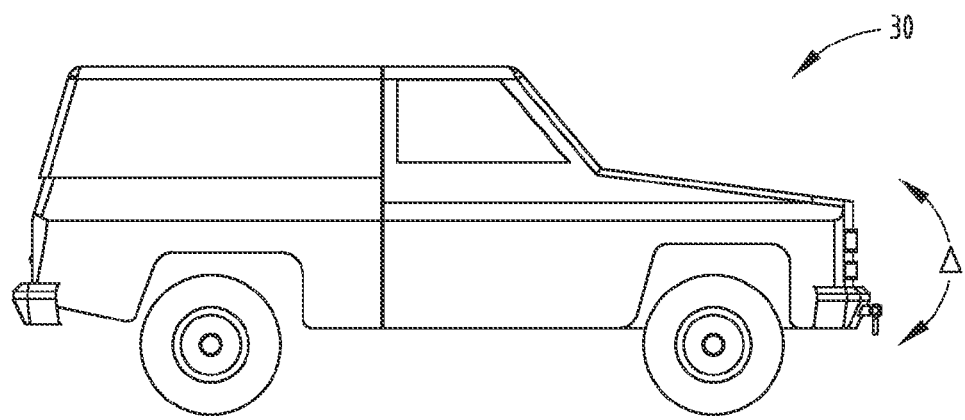
FIG. 1B is a side elevational view of the vehicle of FIG. 1A.
Figure 1C:
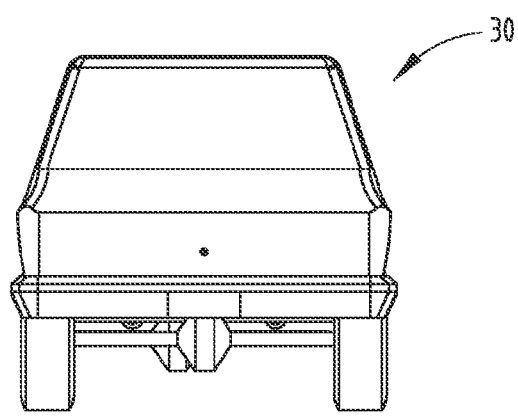
FIG. 1C is another side elevational view of the vehicle of FIG. 1A.
Figure 16:
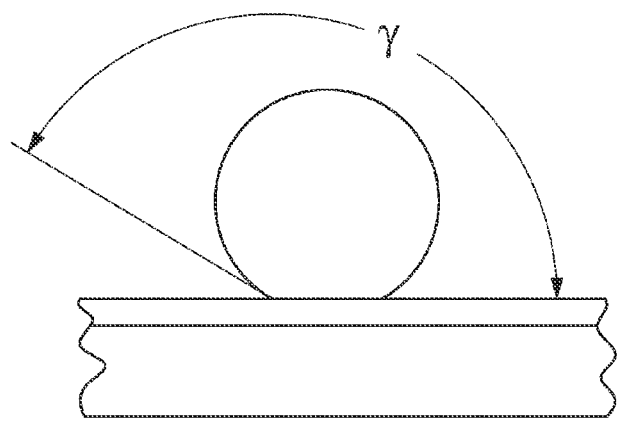
FIG. 16 is a side elevational view of a liquid droplet on a surface.

As shown in FIGS. 1A-1C, the piezoelectric device 10 is designed for use in the vehicle 30, although other operational environments are also contemplated. The piezoelectric device 10 defines an internal cavity for use with the light sensor device 12, which may be disposed in a variety of positions on the vehicle 30. Specifically, it is contemplated that the light sensor device 12 and the piezoelectric device 10 may be positioned on a rear portion of the vehicle 30, as shown in FIGS. 1A and 1C, or a forward portion of the vehicle 30, as shown in FIG. 16. It is also contemplated that the piezoelectric device 10 and the light sensor device 12 may be positioned on sides of the vehicle 30, such that a plurality of light sensor devices can sense images around the entire perimeter of the vehicle 30 or on top or below vehicle 30. Each light sensor device 12 includes a light sensor device lens 38 that is protected by the lens cover 20. The light sensor device 12 is generally positioned on the vehicle 30 to provide a wide angle view of Δ. The light sensor device 12 may be an apparatus with a single light sensor or an apparatus with a plurality of light sensors (e.g., a multi-pixel imager or camera). For example, the light sensor device 12 may be a one of a variety of light sensors as described in U.S. Pat. No. 5,837,994; U.S. Patent Application Publication Nos. 2010/0188540, 2010/0187407, 2009/0256938, 2009/0190015, 2009/0160987, and 2008/0192132, which are hereby incorporated herein by reference in their entirety.

The housing 14 of the piezoelectric device 10 includes a front face 40 designed for abutting engagement with a rear face 42 of the isolator 22, which performs a generally mechanical function, such as dampening vibrations to the housing 14. The housing 14 includes a wall structure 37 that generally defines a receiving cavity 39 that receives and supports the light sensor device 12. A front face 44 of the isolator 22 is designed to abut or adhere to a rear face 46 of the piezoelectric transducer 16. The piezoelectric transducer 16 includes a front face 48 that the lens cover 20 directly or is in abutting contact with, and possibly adhered to a rear face 46 of the connector 24, which performs an electrical isolation function, and also vibrationally couples the lens cover 20 to the transducer 16. The connector 24 includes a rearward face 50 and a forward face 52 that are in abutting contact with an internal or rear face 54 of the lens cover 20. An external, forward, or front face 56 of the lens cover 20 is generally exposed to the environment. Accordingly, the piezoelectric transducer 16 is sufficiently sandwiched between the connector 24 and the isolator 22. Contacts 58, 59 are positioned on the lens cover 20. Transducer contacts 61, 63 relay power to the piezoelectric transducer 16 from a power source. It will be understood that the lens cover 20 is generally construed to be a substantially transparent cover that protects the light sensor device lens 38 or may actually be the outermost lens used by the light sensor device 12. The vibratory assembly 8 should be suitably sealed to keep water and other liquids from penetrating into the vibratory assembly 8 or the light sensor area.

Lens Cover

Referring to the embodiment illustrated in FIGS. 2-7, the lens cover 20 includes a rounded or arcuate viewing pane 60. A rim 62 extends around the viewing pane 60 and is adapted for connection with the housing 14 of the piezoelectric device 10. Differences in the fit between the rim 62 and the front face 48 of the transducer 16 can be filled with the connector 24, which may be an isolator material. Both the viewing pane 60 and the rim 62 define the front face 56 and the rear face 54 of the lens cover 20. The curvature of the viewing pane 60 of the lens cover 20 can generally match or conforms with the curvature of the light sensor device lens 38. However, it is contemplated that the curvature of the viewing pane 60 may be different than the curvature of the light sensor device lens 38. The light sensor device lens 38 could be nearly flat, hemispherical, or any arcuate construction therebetween. In addition, it is contemplated that flat or formed surfaces on the front face 48 of the piezoelectric transducer 16 will generally conform with the shape of the rim 62 of the lens cover 20. In the event the shape of the front face 48 of the piezoelectric transducer 16 does pot generally conform with the shape of the rear face 54 of the rim 62 of the lens cover 20, a gap may be created. A rigid adhesive, such as an epoxy, glass frit, or ceramic, can be utilized to fill in the gap space. The lens cover 20, connector 24, piezoelectric transducer 16, isolator 22, and housing 14 can be operably coupled in a variety of ways known in the art, such as by adhesives, mechanical fasteners, etc. Any bonding lines developed by adhering the lens cover 20 to the piezoelectric transducer 16 could create undesired stresses. Accordingly, depending on the application, the bonding lines may be disposed inbound of the lens cover 20 edge. Any or all of the components such as the lens cover 20, connector 24, piezoelectric transducer 16, isolator 22, and housing 14 can also be operably coupled by mechanical compression or attachment such that the components that make up the piezoelectric device 10 are held together by friction. The mass of the lens cover 20 is generally contemplated to be sufficiently robust to withstand the vibrations associated with actuation of the piezoelectric device 10. To minimize the likelihood of cracking, the lens cover 20 is made with strong edges having minimal or no defects. The lens cover 20 could also be made more robust, for instance, by tempering the external surfaces of the lens cover 20 through thermal or chemical tempering techniques as understood in the art. The edges of the lens cover 20 can be made more robust by grinding, beveling, pencil-edging, polishing, and/or tempering. The strength of the glass and quality of the edge of the glass used to form the lens cover 20 should be of good quality and free of flaws. Small micro-cracks can grow and cause failure in the lens cover 20 when exposed to repeated flexing. Further, attachment of the lens cover 20 to the housing 14 must be done such that the overall stress on the edge of the lens cover 20 is reduced. A thermally cured epoxy will frequently shrink after cooling and will cause stress on the surface and/or edges of the glass. Thermal stress, in combination with intermittent dynamic stresses from the action of the piezoelectric device 10, can cause small cracks to grow and lead to glass failure. To minimize the risk of glass failure in the lens cover 20, the lens cover 20 can be attached to the piezoelectric device 10 using a material that transfers a low amount of stress to the lens cover 20 generally. Alternatively, the attachment of the lens cover 20 may be made at a part of the glass surface that is stronger than the edge and not at the edge of the lens cover 20. Furthermore, the edge of the lens cover 20 can be made more durable by grinding the edge of the lens cover 20. A ground glass edge is generally stronger than a cut and seamed edge. For example, the final edge treatment of the glass may be polished using a grit of 30 microns or smaller to reduce the size of any edge damage. A polished edge will typically produce a strong edge, as long as the polishing process does not overheat the edge of the lens cover 20. Moreover, the edge of the lens cover 20 may be further strengthened by abrading the glass in a direction that is generally parallel to the surface of the substrate of the glass of the lens cover 20. For example, grinding with a belt or a wheel 90° to the surface typically produces a weaker edge, while grinding at an angle of less than 20°, and even less than 10°, can provide a stronger edge. The vibrations associated with the piezoelectric device 10 may increase the rate of glass breakage, such that strengthening the lens cover 20 may be appropriate. If glass is used to create the lens cover 20, thicker glass with increased overall strength may be utilized. However, the added weight of the glass may limit the action of the piezoelectric device 10 on the lens cover 20. Alternatively, thinner glass may be used and will generally flex more, but may be weaker than thicker glass. Accordingly, chemically or thermally strengthening the glass my prove appropriate in certain applications. For example, chemically strengthened glass, such as Corning® Gorilla® glass, can be used. Alternatively, the lens cover 20 may include a laminate to minimize glass breakage. Yet another embodiment incorporates a fully tempered glass to minimize the likelihood of breakage of the lens cover 20. In addition, the lens cover contacts 58 and 59 could be coated with a solderable coating, such as a thin film coating of, for example, chrome and rhodium, chrome and nickel, or chrome and ruthenium or a solderable glass frit. The lens cover 20 may also be heated, as disclosed in further detail herein.

Figure 8A:
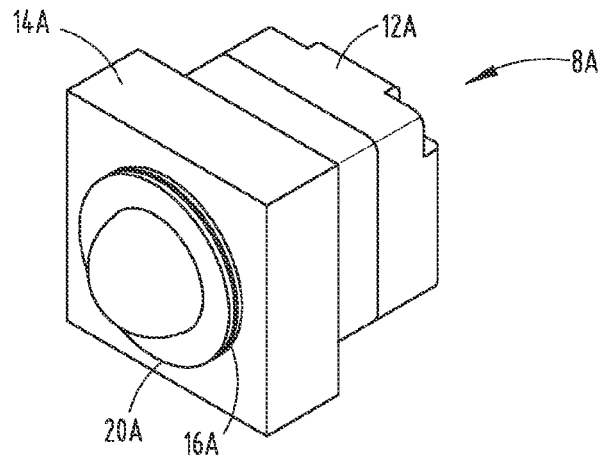
FIG. 8A is a top perspective view of another embodiment of a piezoelectric system of the present invention.
Figure 8B:
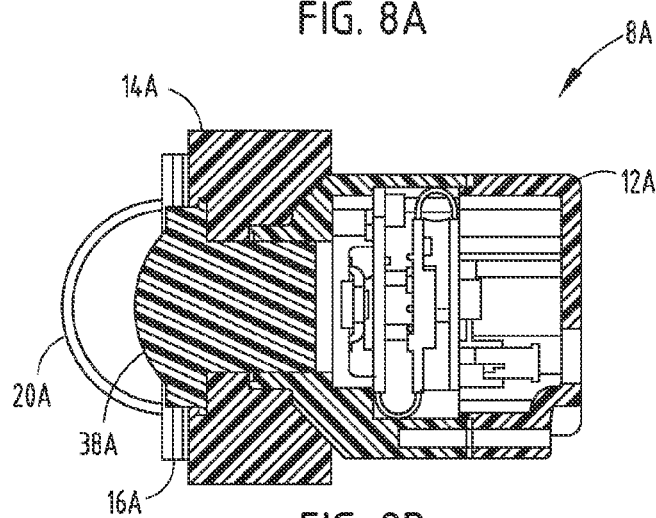
FIG. 8B is a side cross-sectional view of the piezoelectric system of FIG. 8A.
Figure 8C:
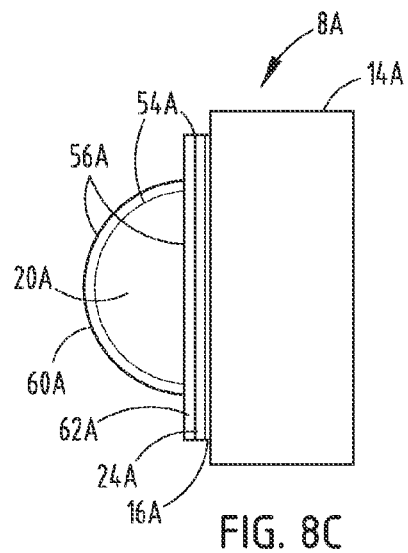
FIG. 8C is a top plan view of a portion of the piezoelectric system of FIG. 8A.
Figure 9:
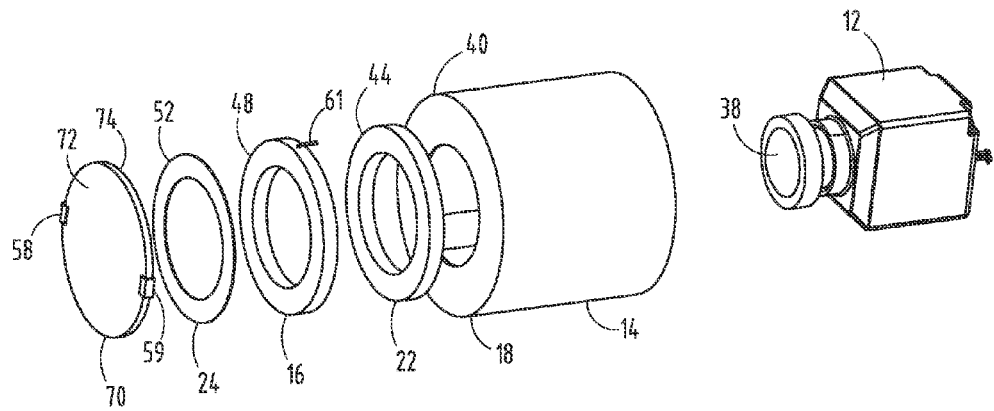
FIG. 9 is an exploded top perspective view of another embodiment of a piezoelectric system of the present invention.
Figure 10:
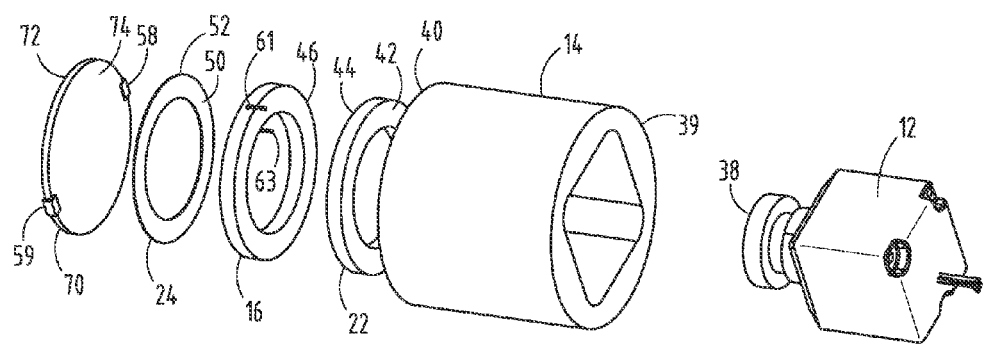
FIG. 10 is an exploded rear perspective view of the piezoelectric system of FIG. 9.
Figure 11:
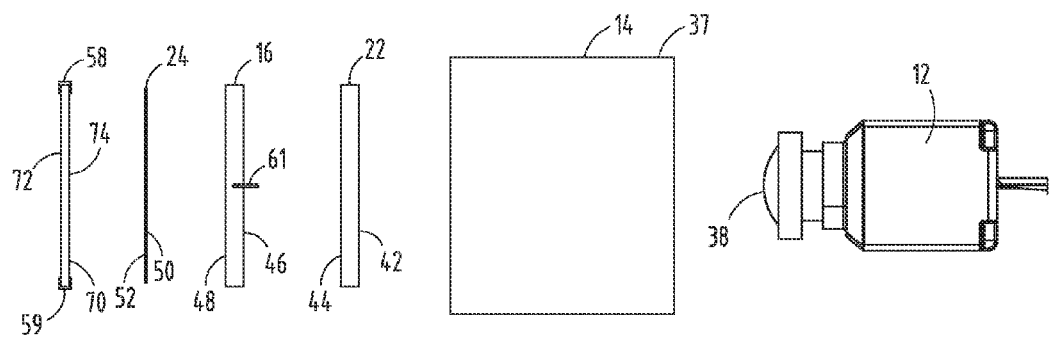
FIG. 11 is an exploded top plan view of the piezoelectric system of FIG. 9.
Figure 12:
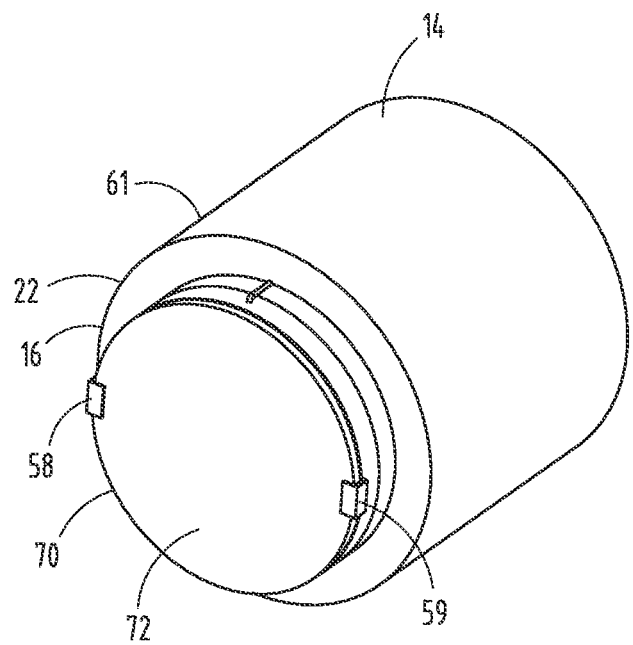
FIG. 12 is a front perspective view of an assembled piezoelectric system of the present invention.
Figure 13:
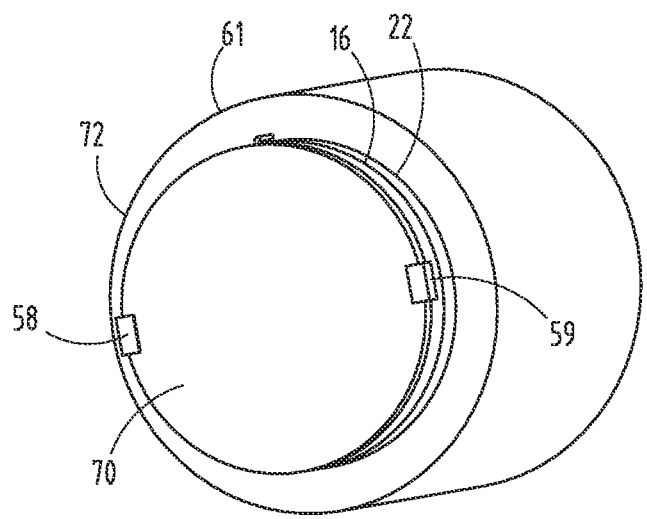
FIG. 13 is a front perspective view of the piezoelectric system of FIG. 12.

Another embodiment as illustrated in FIGS. 8A-8C includes a slightly different vibratory assembly 8A having a piezoelectric transducer 16A with a lens cover 20A that does not have the same arcuate slope as a light sensor device lens 38A. A viewing pane 60A and a rim 62A define a front face 56A and a rear face 54A of the lens cover 20A. The curvature of the viewing pane 60A of the lens cover 20A includes a smaller radius than the curvature of the light sensor device lens 38A. In addition, a housing 14A includes a box-like construction. The other components of the vibratory assembly 8A are substantially similar to those of the vibratory assembly 8.

FIGS. 9-13 illustrate another embodiment that is similar to the embodiment discussed herein referencing FIGS. 2-8C, but instead includes a lens cover 70 having a front face 72 and a rear face 74. Although the illustrated embodiment does not include a rim on the lens cover 70, it is contemplated that a distinct rim that protrudes, or is recessed or is co-planar with the lens cover 70, could be disposed on an outer circumference of the planar lens cover 70. It is contemplated that flat or formed surfaces on the front face 48 of the piezoelectric transducer 16 will generally conform with the shape of the lens cover 70 or the rim of the lens cover 70, if a rim is present. In the event the surfaces on the front face 48 and rear face 46 of the piezoelectric transducer 16 do not generally conform with the shape of the rim of the lens cover 70, a gap may be created. A rigid adhesive, such as an epoxy, glass frit, or ceramic can be utilized to fill in the gap space. It is generally contemplated that the lens cover 70 can be attached to the piezoelectric transducer 16 by a metal solder, glass frit, or adhesive, such as an epoxy, acrylic, or urethane adhesive, or a ceramic cement and may contain spacers such as glass beads or fibers to control the gap between the rear face 74 of the lens cover 70 and the front face 48 of the transducer 16.

Figure 14A:
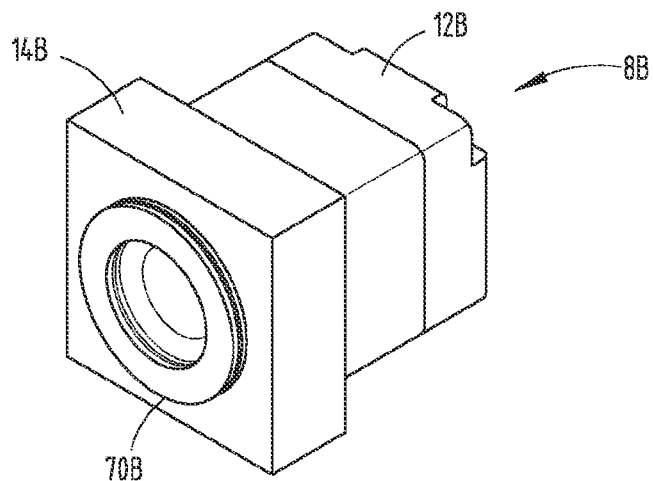
FIG. 14A is a top perspective view of another embodiment of a piezoelectric system of the present invention.
Figure 14B:
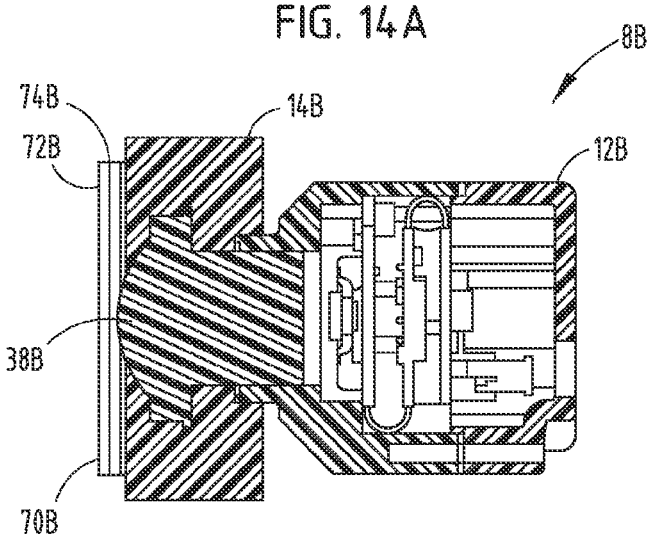
FIG. 14B is a side cross-sectional view of the piezoelectric system of FIG. 14A.
Figure 14C:
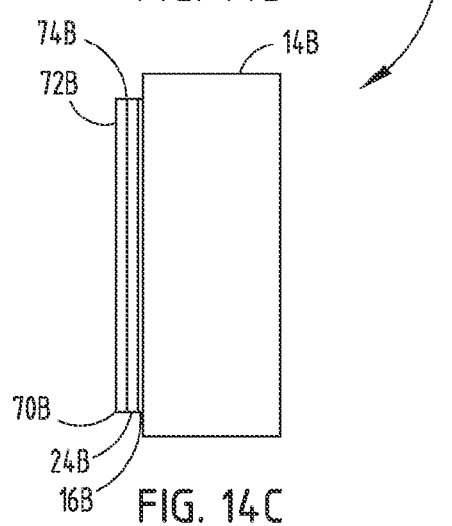
FIG. 14C is a top plan view of a portion of the piezoelectric system of FIG. 14A.

In another embodiment as shown in FIGS. 14A-14C, a vibratory assembly 8B is illustrated with a planar, or possibly recessed, lens cover 70B. The lens cover 70B protects a light sensor device lens 38B, but does not protrude forward like the lens covers 20, 20A disclosed above. The lens cover 70B includes a front face 72B and a rear face 74B that is adjacent to a connector 24B and piezoelectric transducer 16B. The piezoelectric assembly is disposed in a housing 14B having a box-like construction. The other components of the vibratory assembly 8B are substantially similar to those of the vibratory assemblies 8 and 8A.

Figure 15A:
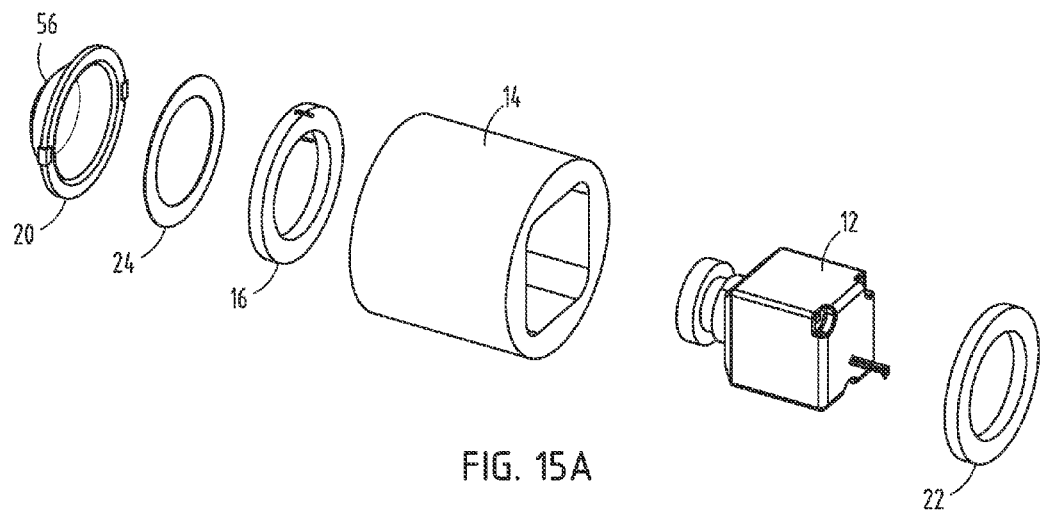
FIG. 15A is an exploded top perspective view of another embodiment of a piezoelectric system of the present invention.
Figure 15B:
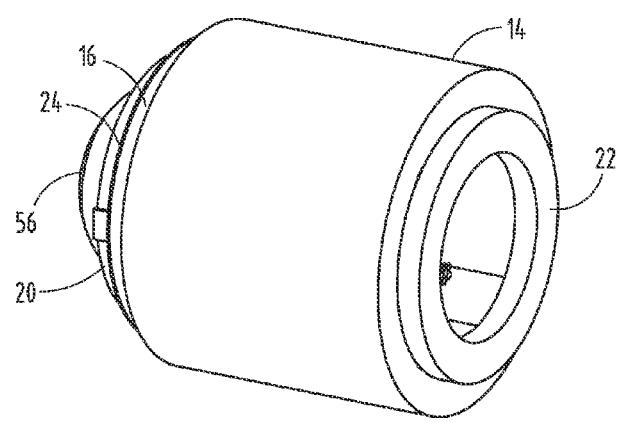
FIG. 15B is an assembled top perspective view of another embodiment of a piezoelectric system of the present invention.

In yet another embodiment, as shown in FIGS. 15A and 15B, the isolator 22 is positioned on a rear face of the housing 14, away from the piezoelectric transducer 16. In this instance, the piezoelectric transducer 16 is in direct contact with the lens cover 20 and housing 14 and converts electrical energy to mechanical energy upon activation of the power source, thereby causing the entire housing 14, as well as the lens cover 20, to vibrate. It is generally contemplated that the light sensor device 12 will not be vibrationally coupled with the housing 14 or piezoelectric transducer 16. Nevertheless, the light sensor device 12 could be vibrationally coupled with the housing 14 or piezoelectric transducer 16.

For each of the embodiments disclosed herein, to prevent reflections in and on the lens cover, the lens cover may be angled so that internal reflectance between the lens cover and other lens members (such as the light sensor device lens) are less likely to be reflected into the light sensor device. The exact angle that is incorporated will generally depend on the geometry of the construction of the lens cleaning apparatus. Generally, the closer the lens cover is to the lens cleaning apparatus, and specifically, the lens of the light sensor device, the greater the angle needed to significantly reduce internal reflections. Many traditional AR coatings that can be applied to the external surface of the lens cover are often rendered ineffective after contamination by debris. Consequently, even if the external surface of the lens cover includes an AR coating, contaminants and debris can cause the reflectance to be as high or even higher than the lens cover if the lens cover was not covered with an AR coating at all. An angle greater than 5°, and generally greater than 10°, prevents most internal reflections from occurring, even when the internal lens surfaces include an AR coating.

The lens covers discussed herein may be constructed from flat glass such as soda lime glass, or borosilicate glass, and range in thickness from about 0.4 mm to 3 mm in thickness. In one embodiment, the glass thickness is 0.7 mm to 2.2 mm, and in yet another embodiment, the glass thickness is 0.9 mm to 1.6 mm. The glass may include a high iron content to absorb infrared (IR) light, or may include a thin film coating to absorb or reflect IR light. Alternatively, a clear, ultra white, or very low iron content solar glass may be used for high transmission applications. The glass may be constructed of high strength glass, such as Corning® Gorilla® Glass or other glass that can be tempered by heat, chemicals, or other means. The lens cover can also be a transparent ceramic, such as sapphire ($Al_2O_3$), quartz ($SiO_2$), or fused-silica ($SiO_2$). The edges of the lens cover 20 can be made stronger by grinding, seaming, beveling, pencil-edging, polishing, tempering, or a combination of the above. Alternatively, the glass may be a laminated glass. The lens cover may also serve as a variable attenuation filter for visible or IR light, similar to an electrochromic (EC) or liquid crystal (LC) device. It is also contemplated that the lens cover could be constructed from rigid plastic. The lens cover may be molded to shape by being ground or polished, or press-bent into shape and optionally ground and polished. The edge profile could be scribed, ground, or seamed to shape. In one embodiment, the edges are very high in strength and durable with a minimum number of defects to prevent glass cracking or breaking during use. The piezoelectric transducer 16 may be bonded to the lens cover 20 with the bond line inside an edge of the lens cover 20 so that the bond is adhered to a stronger surface of the lens cover 20 away from defect-prone edges. It is also contemplated that the lens cover may be constructed from quartz, such that the lens cover also acts as a transducer in combination with the piezoelectric transducer, or as a stand-alone transducer. Thus, the lens cover serves the purpose of protecting the light sensor device, and at the same time provides piezoelectric characteristics to the piezoelectric device.

Surface Treatments

The front faces 56, 72 of the outer lens or lens covers 20, 70 are generally exposed to the elements as well as debris, which includes, but is not limited to, dirt, snow, ice, and water. Water droplet formation on the lens covers 20, 70 can distort images detected by the light sensor device 12, and are therefore undesirable. Surface properties affect droplet formation and adhesion. The surface properties, related to water management, can be broken down into three broad categories. Hydrophilic represents a water spreading surface, while hydrophobic represents a water repelling surface. Super hydrophobic is a subset of the hydrophobic when the water (or other polar liquid) wets very little. The contact angle is used to quantify the interaction of a droplet of liquid and a surface. The angle $\gamma$ is measured from the substrate surface to the tangent of the part of the droplet surface in contact with the surface of the substrate, as shown in FIG. 16.

Figure 17A:
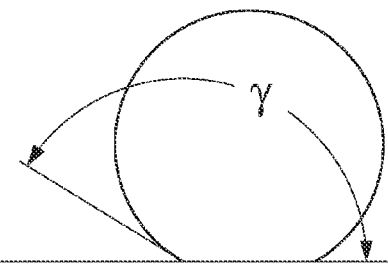
FIG. 17A is a side elevational view of a liquid droplet on a surface.
Figure 17B:
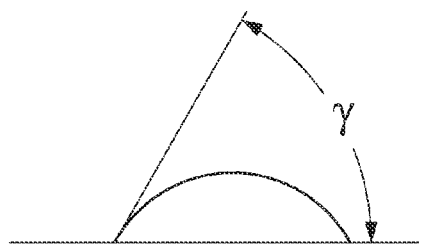
FIG. 17B is a side elevational view of a liquid droplet on a surface.

Referring now to FIGS. 17A and 17B, the relative contact angles for a hydrophilic surface and a hydrophobic surface are illustrated. For example, hydrophobic surfaces tend to have water contact angles greater than about 90 degrees. As the hydrophobic surface moves into the super hydrophobic range, very little contact area is present at the water droplet to substrate interface such that contact angle γ may exceed about 120 degrees (FIG. 17A). Hydrophilic surfaces typically have a water contact angle γ less than about 30 degrees (FIG. 17B).

The two types of surfaces are important for light sensor devices that include a lens cover, as well as those that do not. In the case of a system with a light sensor device lens and a lens cover (FIGS. 2-14C), it may be desirable that the inner surfaces are hydrophilic. In some embodiments, it is contemplated that the area between the light sensor device lens and the lens cover will not be hermetically sealed relative to the environment. Small amounts of water vapor may end up in the space between the lens and the lens cover. The hydrophilic surface prevents droplet formation and the subsequent degradation of image quality associated with droplet formation on either the light sensor device lens or the rear face 54 of the lens cover 20.

In addition to water vapor, volatile organic compounds may be present in the space between the light sensor device lens 38 and lens cover 20 due, in part, to outgassing of plastic or rubber components, adhesives, sealants, or paints in contact with a chamber formed between the light sensor device lens 38 and the lens cover 20. The build-up of the organic compounds on the rear face 54 of the lens cover 20 or on the light sensor device lens 38, would result in a degradation of the image. In order to counteract this phenomenon, a photocatalytic hydrophilic surface treatment may be applied to either the light sensor device lens 38, lens cover 20, or both surfaces. Details of viable photocatalytic hydrophilic surfaces are described in U.S. Pat. Nos. 6,789,906; 6,816,297; and 6,991,339, which are hereby incorporated herein by reference in their entirety. The photocatalytic effect is produced by the reaction of ultraviolet (UV) light with a photoactive compound, such as titanium dioxide or the like. The UV light interacts with a band-gap of the $TiO_2$ crystal to create electron and hole pairs. The electron and/or hole pairs migrate to the surface of the $TiO_2$ where the surface chemistry of the $TiO_2$ and water lead to the formation of chemical species that chemically oxidize organic compounds that may be present on the surface. The build-up of organic materials may therefore be mitigated or reduced by the photocatalytic reaction. The photocatalytic materials are generally present as discrete layers or as nanocrystals in a host matrix. Other photocatalytic means, as understood by a person having ordinary skill in the art, may also be employed. Condensed water can also be eliminated by heating the light sensor device lens 38, lens cover 20, or lens cleaning apparatus.

Diamond-like carbon (DLC) is a general class of carbon-based materials that has similar properties to a diamond. A diamond is a cubic, crystalline allotrope of essentially pure carbon. The family of DLC materials tends to be amorphous and may contain a mixture of cubic and hexagonal phases. Materials like tetrahedral amorphous carbon (taC) and partially hydrogenated tetrahedral amorphous carbon (taC:H) are members of the DLC family. DLC family materials can be much easier to deposit than, and have properties similar to, if not as extreme as, crystalline diamond. For example, three of these properties are hardness, coefficient of friction, and chemical resistance. DLC materials have been used (i.e., by Guardian, Diamonex) to provide scratch resistance to glass surfaces. These materials can be deposited via thermal chemical vapor deposition (CVD), plasma enhanced chemical vapor deposition (PECVD), and physical vapor deposition (PVD) processes, such as ion-beam deposition, ion assisted sputtering, and ion assisted evaporation. The incorporation of a DLC coating onto a first surface of the lens cover 20 would significantly increase its resistance to scratching and chemical damage. The potential for damage to the front or rear surface of the lens cover 20 by micro-cavitation of water during oscillation of the piezoelectric transducer 16 would also be significantly reduced by the addition of a DLC coating to the surface of the lens cover 20. Certain doped DLC materials can be reasonably hydrophobic. In certain embodiments, a thin $SiO_2$, or equivalent, coating can be deposited over the DLC layer in order to provide a suitable layer for the attachment of the more common silane-based hydrophobic chemistries used to provide a hydrophobic surface.

The light sensor device lens or lens cover (if one is present) may have an untreated surface, or can be photocatalytic, hydrophobic, or super hydrophobic. In one embodiment, the light sensor device lens or lens cover has super hydrophobic characteristics. Thus, water droplets applied to the front face of the lens cover will "ball up" and not spread out over the front face of the lens cover. As the droplet evaporates or dries, the contaminants and minerals in the water will be located primarily at the location where the droplet contacts the surface. This leads to a localized deposit of the residual contaminants rather than a more even spread out dirt layer that occurs with the hydrophilic layer. In one embodiment of the present invention, droplets of liquid do not adhere to the front face of the lens cover at all. Accordingly, little or no dirt can build-up if the droplet carrying the dirt cannot maintain contact with the front face of the lens cover and be allowed to dry. The probability of initial adherence of the droplet and subsequent residence time are both affected by the surface characteristics of the substrate. Droplets and debris that do accumulate on a treated surface, whether hydrophobic or super hydrophobic (explained in detail below) are not anchored to the surface firmly and can be dislodged at lower energies applied to the piezo system or liquid spray system. The low surface energy of a hydrophobic surface has the additional benefit of being less attractive to dust, dirt, or similar particles which tend to be charged. This results in a reduced uptake of particulate contaminates relative to a higher energy surface, and also makes it easier to dislodge particular contaminates once they are present.

Figure 18:
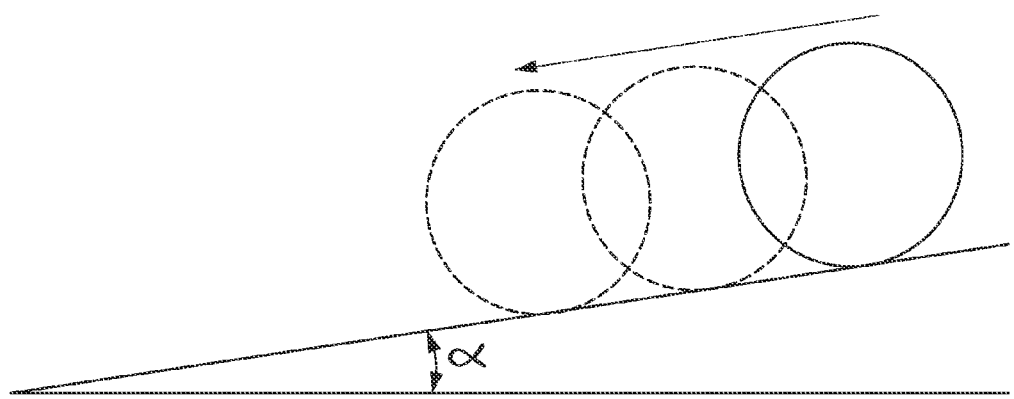
FIG. 18 is a side elevational view of a liquid droplet on a sloped surface.

The tilt angle is another surface attribute that affects droplet or water adhesion. The tilt angle, for purposes of this application, is generally defined as the angle a surface has to be tilted from a horizontal position, at which point a droplet will roll off of the surface (FIG. 18). Low tilt angles α represent situations with very low adhesion strength between the droplet and the surface, while a high tilt angle α represents strong adhesion strength. The tilt angle and contact angle, in general, may be somewhat independent characteristics. However, super hydrophobic surfaces generally include both high contact angles and low tilt angles. Due to the high energy imperfections present in many hydrophobic surfaces, which cause the high adhesion strength points that can trap droplets, it may be beneficial to combine hydrophilic zones with hydrophobic zones on a surface. A hydrophobic surface can only try and "push" a droplet away. A hydrophilic surface attempts to "pull" the droplet over its entire surface. When used optimally, the combination of a hydrophobic and hydrophilic surface can significantly increase the force applied to a droplet in the vicinity of the interface between the two zones, making it more likely to remove the droplet from the hydrophobic surface. In this manner, the hydrophilic zones act as gutters, improving the overall ability of the surface to shed water.

The combination of high contact angle and low tilt angle increases the probability that a droplet on the surface of the light sensor device lens or lens cover will roll off of the surface or be poorly adhered such that normal vibrations resulting from vehicle motion will dislodge the droplet before evaporation can occur. This will leave the surface cleaner for a longer period of time. In situations where the vibration motion derived from vehicle motion is not adequate, supplemental energy may be employed. The droplet or debris that is poorly adhering due to the super hydrophobic surface, will be easily dislodged. In the case where the vibration is augmented by the piezoelectric device disclosed in detail herein, or augmented by a liquid spray system or a combination of the two, a hydrophobic surface may be adequate for helping keep the lens cover or lens of the light sensor device clean.

When removing water droplets from the lens cover 20 using the piezoelectric device 10, water droplets from the center of the lens cover 20 are often removed easier than from edges of the lens cover 20. Accordingly, an aperture in the lens cover 20 may be located away from the edges of a substrate. The distance is generally determined as a function of the modulus of elasticity of the material and the design and shape of the lens cover 20 and the piezoelectric device 10. For example, a 1.1 mm thick piece of glass will generally have improved water removal properties when the distance from the edge of the lens cover 20 to the attachment point of the piezoelectric device 10 is approximately 3 to 5 mm.

A super hydrophobic surface is obtained by combining a textured surface with hydrophobic surface treatments. More specifically, the textured surface is treated with a hydrophobic surface, such as a fluorinated polymer, silane, or the like. The hydrophobic treatment acts synergistically with the textured surface to increase the contact angle and reduce the adhesion strength of the droplet to the surface. This is often referred to as the "lotus leaf effect."

Figure 19:
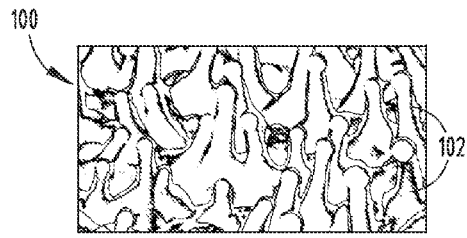
FIG. 19 is a top perspective view of one embodiment of a super hydrophobic surface of the present invention.
Figure 20:
FIG. 20 is a top perspective view of another embodiment of a super hydrophobic surface of the present invention.
Figure 21:
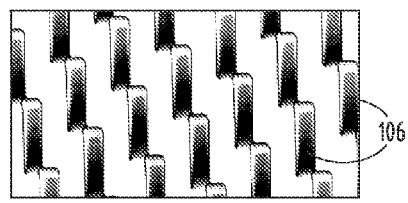
FIG. 21 is a top perspective view of another embodiment of a super hydrophobic surface of the present invention.
Figure 22:
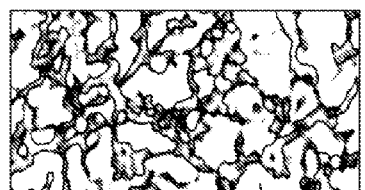
FIG. 22 is a top perspective view of another embodiment of a super hydrophobic surface of the present invention.

FIGS. 19-22 illustrate various surface structures that may be disposed on the light sensor device lens or lens cover that include super hydrophobic characteristics. FIG. 19 depicts a nanospire structure 100 that includes a multitude of elongate spines 102, while FIG. 20 depicts a series of ridges 104 formed on a surface. FIG. 21 illustrates an engineered surface consisting of a series of rectangular blocks 106 generally equidistantly spaced, and FIG. 22 illustrates a porous surface 108 that results in an irregular contact surface with an increased surface area. Each of these surface types may be used to create a super hydrophobic structure for use on the front face of the lens cover. These surface types are to serve as examples only.

It is also contemplated that a hydrophobic coating replenishing device, such as a wiping blade, with a hydrophobic silicone oil could be used to wipe the lens cover 20, and at the same time, replenish the hydrophobic properties of the lens cover 20. As another example, a ring impregnated with silicone can be incorporated into the outer structure of the piezoelectric device 10 to replenish the hydrophobic material on the lens cover 20.

Figure 23:
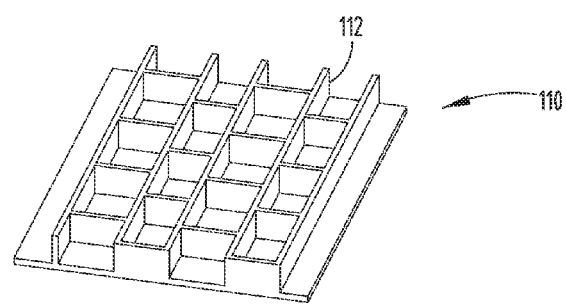
FIG. 23 is a top perspective view of another super hydrophobic surface of the present invention.
Figure 24:
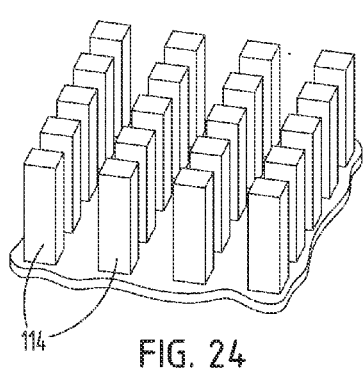
FIG. 24 is a top perspective view of another super hydrophobic surface of the present invention.
Figure 25:
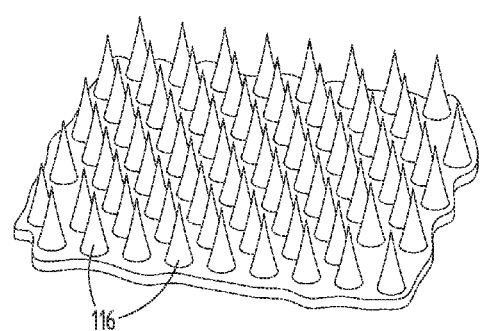
FIG. 25 is a top perspective view of another super hydrophobic surface of the present invention.

Referring now to FIG. 23, an engineered surface 110 having a series of walls 112 may be disposed on the light sensor device lens or lens cover. The spacing between adjacent walls 112 may be adjusted to tune the water repellent characteristics of the light sensor device lens or lens cover. Further, the relative size of the features in the engineered surface 110 can be modified, depending on material properties to tune the water repellency properties of the light sensor device lens or lens cover. FIG. 24 illustrates the engineered surface 110 where columns 114 extend from a substrate. FIG. 25 depicts another embodiment wherein cones 116 are present instead of columns 114 or other features.

Referring now to the embodiment of FIGS. 26A and 26B, different surface treatments may be combined on the front face of the light sensor device lens. In FIG. 26A, an entire column 130 includes a hydrophobic surface treatment 132. This fully hydrophobic construction has complete water repellency everywhere. In FIG. 26B, the entire column 130 has a hydrophobic surface treatment 134 between columns 136 and a hydrophilic surface treatment 138 on a top side of the columns 136. This hydrophobic/hydrophilic construction includes columns with surfaces that attract water while having the water simultaneously repelled by the surface areas between the columns 136. The hydrophobic/hydrophilic construction generally prevents water droplets from penetrating into the spaces between the columns 136. The structures of FIGS. 26A and 26B may also protect and prevent the mechanic abrasion of and removal of the hydrophobic material properties between the columns 136.

A super hydrophobic surface may be produced in many different ways. For example, a rough coat can be applied to the front face of the light sensor device lens, which has the appropriate peak to valley distance. Alternatively, micro holes can be created in the coating surface, carbon nanotubes can be deposited on the surface with the ends aligned upward, or the front face can be engineered with columns, spires, walls, cones, or similar structures, as discussed and illustrated herein. A super hydrophobic surface can also be created by roughening or scraping the surface, utilizing self-assembled polymers or molecules, applying nanofibers to the surface, depositing polymers that fracture, treating the surface to etch the surface, depositing nanoparticles on the surface, phase separating the surface, growing crystal on the surface, or controlling the deposition of nanoparticles on the surface. Still other ways of forming a hydrophobic surface include nanomachining the coating to the surface, molding or pressing the shape into the surface, molding or pressing a coating to a shape on the surface, texturizing graphene to the surface, differentially etching the surface, diffusing limited growth processes to the surface, aggregating or assembling particles on the surface, depositing a fluoropolymer on the surface, or etching the surface to give simultaneous structure and hydrophobic properties. Furthermore, a hydrophobic surface can be made by nanoimprinting the surface, bi-layering the surface via reverse imprint lithography, directly metalizing the polymer transfer of the surface, applying lithographic techniques to the surface, and templating the surface.

An anti-reflectance (AR) layer may be applied as a coating over the lens cover or the light sensor device lens. The AR layer may be constructed from a series of high, intermediate, and low refractive index thin film layers. Alternatively, the AR layer may be formed from low index thin film, such as $MgF_2$, or a porous thin film layer, such as porous $SiO_2$. The AR layer is designed to minimize surface reflections in order to reduce image ghosting concerns and provide sufficient operating conditions for high dynamic range cameras.

In some embodiments, it may be desirable to combine in one coating the ability to heat the cover plate and have anti-reflection properties and photocatalytic properties. The photocatalytic properties arise from the presence of $TiO_2$ in the coating in a crystalline form consistent with characteristics that yield photocatalytic properties. In addition, a layer of ITO or the like is added below the $TiO_2$, which, when electricity is applied, provides the heating properties. The $TiO_2$ is capped with a layer of $SiO_2$ to help enable the anti-reflection properties.

FIG. 27 shows the reflectance spectrum of the coated surface of three anti-reflection coatings. The table below has the refractive indices of the layers, their thicknesses (nm), reflectance versus wavelength, and integrated percent reflectance (cap Y).

art. It is also possible to add a glass frit material, or to laminate a polymer material with a pressure sensitive adhesive or other adhesive. The opaque coating is generally contemplated to be applied to an inside surface of the lens cover 20. However, the opaque coating may also be applied to an outside surface of the lens cover 20. If applied to the outside surface of the lens cover 20, it may also be combined with a hydrophilic or hydrophobic coating, as described herein.

| SiO2 - 1.46 | 85.2 | Y | SiO2 - 1.46 | 85.2 | Y | SiO2 - 1.46 | 85.2 | Y |
|---|---|---|---|---|---|---|---|---|
| TiO2 - 2.64 | 91.9 | 0.60% | TiO2 - 2.64 | 91.9 | 0.36% | TiO2 - 2.56 | 91.9 | 0.22% |
| ITO - 1.95 | 62.8 | | ITO - 1.90 | 64.3 | | ITO - 1.81 | 64.3 | |
| Stack | ITO on Glass | | Stack | ITO on Glass | | Stack | ITO on Glass | |
| Incident Angle (deg) | 0 | | Incident Angle (deg) | 0 | | Incident Angle (deg) | 0 | |

| Wavelength (nm) | Reflectance Design 1 | Transmittance (%) | Wavelength (nm) | Reflectance Design 2 | Transmittance (%) | Wavelength (nm) | Reflectance Design 3 | Transmittance (%) |
|---|---|---|---|---|---|---|---|---|
| 400 | 2.59 | 93.29 | 400 | 3.29 | 92.61 | 400 | 3.37 | 92.46 |
| 420 | 0.96 | 96.03 | 420 | 0.88 | 96.08 | 420 | 0.69 | 96.21 |
| 440 | 1.23 | 96.10 | 440 | 0.79 | 96.51 | 440 | 0.45 | 96.80 |
| 460 | 1.20 | 96.42 | 460 | 0.72 | 96.87 | 460 | 0.41 | 97.12 |
| 480 | 0.93 | 97.03 | 480 | 0.52 | 97.41 | 480 | 0.28 | 97.59 |
| 500 | 0.70 | 97.29 | 500 | 0.35 | 97.61 | 500 | 0.15 | 97.75 |
| 520 | 0.60 | 97.32 | 520 | 0.28 | 97.60 | 520 | 0.08 | 97.74 |
| 540 | 0.56 | 97.25 | 540 | 0.26 | 97.52 | 540 | 0.05 | 97.66 |
| 560 | 0.52 | 96.95 | 560 | 0.25 | 97.19 | 560 | 0.07 | 97.31 |
| 580 | 0.47 | 96.84 | 580 | 0.26 | 97.02 | 580 | 0.14 | 97.07 |
| 600 | 0.44 | 96.58 | 600 | 0.32 | 96.67 | 600 | 0.31 | 96.61 |
| 620 | 0.50 | 96.05 | 620 | 0.51 | 96.02 | 620 | 0.63 | 95.82 |
| 640 | 0.74 | 95.39 | 640 | 0.89 | 95.22 | 640 | 1.16 | 94.89 |
| 660 | 1.20 | 94.29 | 660 | 1.51 | 93.96 | 660 | 1.90 | 93.52 |
| 680 | 1.92 | 93.38 | 680 | 2.39 | 92.91 | 680 | 2.86 | 92.38 |
| 700 | 2.90 | 92.10 | 700 | 3.51 | 91.50 | 700 | 4.03 | 90.93 |

In one embodiment, it is contemplated that no coatings may be applied to the lens cover 20. In an alternative construction, the front face 56 and the rear face 54 of the lens cover 20 may be coated with an AR coating. In another alternative construction, the front face 56 of the lens cover 20 may include a hydrophobic coating, while the rear face 54 includes an AR coating. Since rear face 54 is not subject to mechanical abrasion, less durable AR coatings, such as a porous $SiO_2$ coating or an organic layer, may be used. In still another construction, the front face 56 includes a hydrophobic AR coating while the rear face 54 includes an AR coating. In yet another construction, the front face 56 includes a hydrophobic coating while the rear face 54 includes a hydrophilic AR coating. Of course, combinations of these variations on these configurations are also possible.

For each of the aforementioned constructions, the rear face 54 of front face 56 may include electrical contacts that connect with a power source, such that the rear or front faces 54, 56 are heatable. However, it is also contemplated that the rear or front faces 54, 56 may not be heatable surfaces. These coatings may be used in conjunction with the vibratory assembly 8 or without the vibratory assembly 8. A heater may also be incorporated into the vibratory assembly 8, camera body, or image sensor, as desired. The piezoelectric transducer 16 may also generate enough heat to act as a heater for the vibratory assembly 8.

In another embodiment, an opaque, or nearly opaque, coating is applied to a surface of the lens cover 20, such that the interior of the piezoelectric device 10 is substantially hidden from external view. A massed or pattern coating may be used so that an aperture is left in the lens cover 20. The opaque coating may be applied in a variety of manners, such as screen printing, pad printing, inkjet printing (UV curable), sputter coating, evaporation, or similar methods as understood in the Isolators Referring again to the embodiment illustrated in FIGS. 2-8C, the connector 24 is provided between the lens cover 20 and the piezoelectric transducer 16 to separate and form an electrical isolation layer in the form of a barrier member between the piezoelectric transducer 16 and the lens cover 20. Likewise, the isolator 22 is disposed between the housing 14 and the piezoelectric transducer 16. The connector 24 may be approximately 5 nm to 10 mm thick, while the isolator 22 may be approximately 1 µm to 10 mm thick. Both the isolator 22 and the connector 24, as illustrated herein, can be made from a flexible vibration isolating medium, such as a silicone elastomer, a silane modified elastomer, a urethane elastomer, rubbers, such as butyl, EPDM, nitrile, or buna N, a pressure sensitive adhesive layer, a soft open or closed pore foam, or a rubber or foam layer with an adhesive, such as a pressure sensitive adhesive, on the front and rear faces. Bonding adhesives, frits, and solders may be used to maintain the isolator 22 and the connector 24 in position. The isolator 22 and connector 24 can be constructed from isolating material that contains a spacing media, such as glass, ceramic, or plastic or rubber spheres or fibers to aid maintaining a uniform bonding or spacing gap thickness. It is also contemplated that the connector 24 may comprise a thin, rigid material, such as polyamide, a fiber reinforced epoxy, or phenolic resin to better transmit the oscillation of the piezoelectric transducer 16 to the lens cover 20. It is also contemplated that the connector 24 can be removed such that the piezoelectric device 10 includes only the isolator 22, between the piezoelectric transducer 16 and the housing 14. The isolator 22, which generally serves as a mechanical isolator, can also enclose or encompass the edge of the piezo device to further isolate the isolator 22 from the housing 14 and seal the housing 14, preventing the penetration and accumulation of water, liquid, and debris.

Transducer

As discussed herein, the piezoelectric transducers will have engineered mass dimensions and overall shape to efficiently convert electrical pulses to mechanical vibrations. The piezoelectric transducers include an active element, which converts electrical energy into mechanical energy. The active element in simplest terms is a piece of piezoelectric or ferroelectric material with electrodes attached to opposing faces of this active material. When an electric field is applied to the active element, the electrical dipoles of the polarized molecules are re-oriented by the electric field, resulting in the active element changing dimensions. A permanently-polarized material, such as quartz ($SiO_2$) or barium titanate ($BaTiO_3$), will produce an electric field when the material changes dimensions. The dimensions (width, thickness, diameter) of the active element are determined by the desired frequency of the piezoelectric transducer 16. Generally, the higher the operational frequency of the piezoelectric transducer 16, the thinner or smaller the active element dimensions in the piezoelectric transducer 16. The system which includes the piezoelectric transducer 16 and the outer lens or lens cover may be tuned to an ideal operating frequency or range of operating frequencies. Additionally, a portion of the piezoelectric transducer 16 or a separate piezoelectric element can be used to monitor the vibrational activity of the device and tune a drive circuit to operate the piezoelectric transducer 16 at an ideal frequency.

The active element of the piezoelectric transducer 16, as illustrated herein, may be formed from Quartz ($SiO_2$), Berlinite ($AlPO_4$), Gallium orthophosphate ($GaPO_4$), Tourmaline, Barium titanate ($BaTiO_3$), Lead Zirconate Titanate (PZT), Zinc Oxide (ZnO), Aluminum Nitride (AlN), Polyvinylidene Fluoride, Lithium Tantalate, Lanthanum Gallium/silicate, Potassium Sodium Tartrate, other ceramics, such as $KNbO_3$, $Ba_2NaNb_5O_5$, $LiNbO_3$, $SrTiO_3$, $Pb(ZrTi)O_3$, $Pb_2KNb_5O_{15}$, $LiTaO_3$, $BiFeO_3$, $NaxWO_3$, Sodium potassium niobate (NaKNb), Bismuth Ferrite ($BiFeO_3$), Lead Lanthanum Zirconate Titanate, and similar compositions that can be transparent as described in U.S. Pat. No. 4,367,426, which is hereby incorporated herein by reference in its entirety. In addition, it is contemplated that the piezoelectric transducer 16 may include a bimorph-type configuration, such as that described in U.S. Pat. No. 5,724,186, which is incorporated in its entirety herein by reference, which allows the piezoelectric transducer 16 to operate efficiently in low-frequency flexural modes. If the piezoelectric material is transparent, the lens cover or the outer lens could be made of the piezoelectric material.

Figure 28:
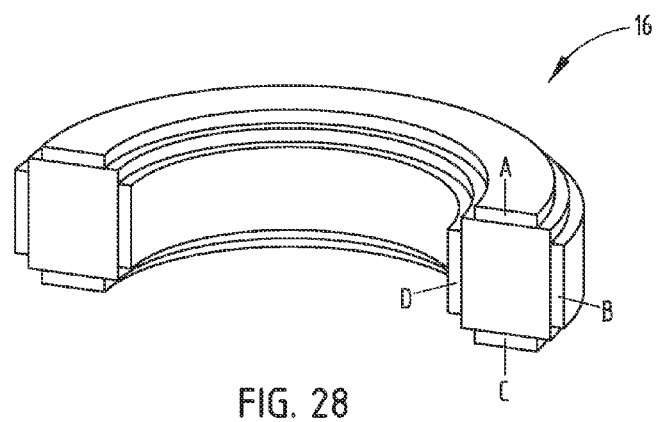
FIG. 28 is a top perspective cross-sectional view of a transducer illustrating various contact positions.

It is generally contemplated that the electrical contacts may be connected to the piezoelectric transducer in a variety of ways. Referring now to FIG. 28, the electrical contacts that relay electricity from the power source can connect with the piezoelectric transducer in a variety of ways. It is generally contemplated that the first and second electrical contacts may be connected with opposing surfaces of the piezoelectric transducer. Specifically, the first contact may be made to side A while the second contact is made to side C. In this instance, opposing surfaces, the front face and rear face of the piezoelectric transducer, are connected with the first and second electrical contacts, respectively. Alternatively, the inner and outer circumferences of the piezoelectric transducer may be connected with the electrical contacts. Thus, a first contact is made to side B and a second contact is made to side D.

In yet another embodiment, as illustrated in FIG. 28, it is contemplated that the first and second electrical contacts may be connected with adjacent surfaces of the piezoelectric transducer. Specifically, the first contact may be made to side A while the second contact is made to side B. In this instance, adjacent surfaces, the front face and the outer circumference of the piezoelectric transducer, are connected with the first and second electrical contacts, respectively. Similarly, the first contact may be made to side A while the second contact is made to side D (the inner circumference of the piezoelectric transducer). Alternatively, the first contact may be made to side C while the second contact is made to side B. Still further, the first contact may be made to side C while the second contact is made to side D. Alternatively, one or both contacts could be a combination of sides. For instance, one contact could be sides A and B and the other contact could be sides C and D.

Figure 29A:
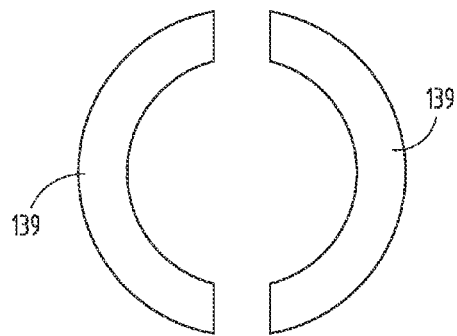
FIG. 29A is a front elevational view of one embodiment of a transducer post configuration.
Figure 29B:
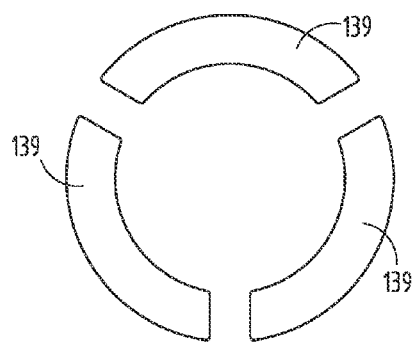
FIG. 29B is a front elevational view of another embodiment of a transducer post configuration.
Figure 29C:
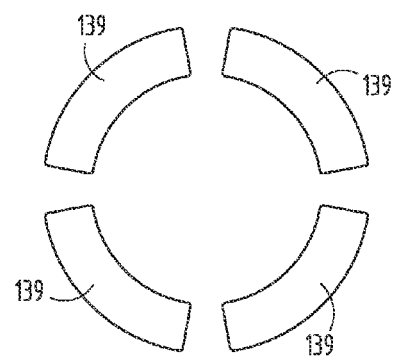
FIG. 29C is a front elevational view of another embodiment of a transducer post configuration.

Referring now to FIGS. 29A-29C, it is also generally contemplated that multiple independent piezoelectric transducers 16 may be utilized to vibrate the lens cover instead of a piezoelectric transducer with a single annulus. More specifically, one could envision the use of two or more distinct transducer posts 139 disposed under the lens cover (FIG. 29A). By way of example, FIG. 29B illustrates a three transducer post configuration, while FIG. 29C illustrates a four transducer post configuration. Each transducer post 139 may include electrical contacts to the power source. Electrical contacts for use in the piezoelectric device 10 are outlined in detail below with reference to FIGS. 30A-31B. Additionally, each transducer post 139 may be operated in phase or out of phase with other transducer posts, thereby creating various vibration modes across the lens cover for efficiently removing debris and/or water.

As shown in the embodiments illustrated in FIGS. 30A-31B, in one configuration, the piezoelectric transducer 16 includes a central aperture 140 such that the piezoelectric transducer 16 has a washer-like construction. The heatable AR, heatable surface treatment, or coating and the piezoelectric systems disclosed herein require electrical contacts to various surfaces of the piezoelectric transducer 16 and the heatable or heated AR coating. The electrodes can be made of or attached with metal loaded adhesive, such as silver filled or gold filled epoxy, conductive inks, bus bars, point contacts, such as clips, solder, conductive frit, conductive non-metallic adhesives or polymers, metal foil, metal stamping(s), physical vapor deposition applied film(s), chemical vapor deposition applied film(s), etc. The contacts or electrodes can be attached to two opposing sides 142A, 144A of the front face 48 of the piezoelectric transducer 16, attached to two opposing sides 142B, 144B of the rear face 46 of the piezoelectric transducer 16, or attached to two opposing sides 142A, 144A of the front face 48 of the piezoelectric transducer 16 and two opposing sides 142B, 144B of the rear face 46 of the piezoelectric transducer 16. The piezoelectric transducer 16, as illustrated, generally includes electrical contacts that engage the front face 48 and rear face 46 of the piezoelectric transducer 16. Alternatively, the piezoelectric transducer 16 may not include electric contacts on the front face 48 and rear face 46 of the piezoelectric transducer 16. Instead, the contacts are made to the inner and outer concentric surfaces 150, 152 of the ring transducer, as shown in FIGS. 31A and 31B. The piezoelectric transducer 16 may be shaped in the form of a cylinder, washer, ring, horse shoe, semicircle, arc, etc.

It is also generally contemplated that the piezoelectric transducer 16 could be vibrationally coupled with the light sensor device lens in addition to, or instead of, the light sensor device. If the piezoelectric transducer 16 is vibrationally coupled to the light sensor device, a very strong robust light sensor device that can withstand substantial vibration will be used.

In one embodiment of the present invention, an electrically resistive coating is applied to the front face 56 of the lens cover 20 and electrical contacts are made directly to the front face 56 of the lens cover 20. At the same time, the rear face 54 of the lens cover 20 is not heated such that the front face 48 and rear face 46 of the piezoelectric transducer 16 can be completely covered with an electrically conductive layer and no electrical isolation layer between the transducer and lens cover is required. Electrical contacts can then be made to the front face 48 and rear face 50 of the piezoelectric transducer 16 to drive the piezoelectric transducer 16.

As illustrated in FIG. 30A, another embodiment of the present invention includes application of an electrically conductive layer to the rear face 54 of the lens cover 20 for the purpose of heating the lens cover 20. The electrical contacts are separated between the rear face 54 of the lens cover 20 and the front face 48 of the piezoelectric transducer 16 by connector 24 to prevent the electrical contacts from shorting each other (notably, the connector 24 would generally not be present in this embodiment).

In another embodiment, illustrated in FIG. 30B, it is possible that one pole of the DC resistive heater on the rear face 54 of the lens cover 20 shares a pole with the forward contact of the piezoelectric transducer 16 on the front face 48 of the piezoelectric transducer 16. In this instance, the electrical contact 59 serves as a first heater contact to the front face 56 of the lens cover 20, and the front face 48 of the piezoelectric transducer 16 serves as a second heater contact to the rear face of the lens cover. At the same time, the front face 48 of the piezoelectric transducer 16 serves as a first transducer contact from the power source and the second transducer contact from the power source is made to the rear face 46 of the piezoelectric transducer 16. Deletion or masking of the resistive heating coating may be applied to control where contact is made from the power source to the resistive coating to control the current path through the resistive coating and optimize heating.

In another embodiment, the connector 24 may be present between the lens cover 20 and the piezoelectric transducer 16 to separate the electrical connections. This configuration is generally illustrated in FIGS. 2-13. The electrical connections 58, 59 are made directly to the lens cover 20 to drive resistive heating (FIG. 30C). At the same time, electrical connections 61, 63 are made directly to the front face 48 and rear face 46 of the piezoelectric transducer 16 from the power source to drive the piezoelectric transducer 16.

As mentioned above, the piezoelectric transducer 16 may include contacts that extend to the inner and outer concentric surfaces 150, 152 of the piezoelectric transducer 16 (FIG. 31A). This construction is generally shown in FIGS. 2-13 above. In an alternative embodiment of the present invention, each of the inner and outer concentric surfaces 150, 152 of the piezoelectric transducer 16 are covered by a conductive electrode layer and electrical contact is made to each of the electrodes by a standard method, such as soldering or wire bonding. Electrical contacts that are made to the inner and outer concentric surfaces 150, 152 of the piezoelectric transducer 16 may simplify any potential electrical contacts to an optional heatable layer on the rear face 54 of the lens cover 20 and also enable contact to a heater. Nevertheless, the proximity of the conductive layers on the inner and outer concentric surfaces 150, 152 of the piezoelectric transducer 16 to the contacts of the heatable layer may call for use of an insulating layer between the piezoelectric transducer 16 and the heatable layer, or possible deletion of conductive layers that are in close proximity to the front face 48 and rear face 46 of the piezoelectric transducer 16. It may also be desirable to heat the light sensor device 12 to avoid the condensation on the lens cover and/or sensor surfaces and avoid changes in lens focus properties due to thermal expansion or contraction of the lens or lens assembly. This can be accomplished by heating housing 14 and/or the light sensor device 12 with a heating device.

In addition, it is contemplated that the mechanical energy and sound waves developed by the piezoelectric transducer 16 can be used in conjunction with a fluid delivery system disposed adjacent to the lens cover. Vibrational energy and/or high frequency sound waves are developed by the piezoelectric transducer and interact with a cleaning fluid provided by the fluid delivery system. The sound waves penetrate the fluid and travel through the fluid, possibly resulting in cavitation. If cavitation occurs, microscopic bubbles are formed in the fluid and repeatedly implode upon the front face of the lens cover as the fluid flows over the lens cover. This action removes visible debris and microscopic particles from the lens cover. Further, the vibrational action caused by the piezoelectric transducer can aid in drying the lens by atomizing the excess fluid. The fluid of the fluid delivery system may be applied to the lens cover before the piezoelectric transducer is activated and/or during the activity of the piezoelectric transducer 16.

The piezoelectric transducer 16 can be configured in a variety of manners. The piezoelectric transducer 16 may include a somewhat planar construction, as depicted in FIGS. 2-13. Alternatively, the piezoelectric transducer 16 may have a cylindrical type construction 199, as shown in FIG. 31C. The piezoelectric transducer 16 of FIG. 31C is constructed of a ceramic material known in the industry as SMIII. The piezoelectric transducer 16 has an outside diameter of 38 mm, an inside diameter of 31 mm, and a wall thickness of 25 mm. Thus, the piezoelectric transducer 16 can have a cylindrical construction, wherein the length of the piezoelectric transducer 16 is greater than the radius of the piezoelectric transducer 16.

Housing

With regard to FIGS. 2-14, the light sensor device housing 14 can be formed from any of a variety of materials including metal, plastic, etc. The housing 14 is generally designed to house and protect the light sensor device 12 and provide a means by which the light sensor device 12 can be supported in or on the vehicle 30. The housing 14 includes a wall thickness sufficient to withstand frequent vibration cycles imposed by the piezoelectric transducer 16. As discussed herein with reference to FIGS. 35-39, a piezoelectric device may also be installed that is operably coupled with a housing having a clear protective cover assembly.

Figure 35:
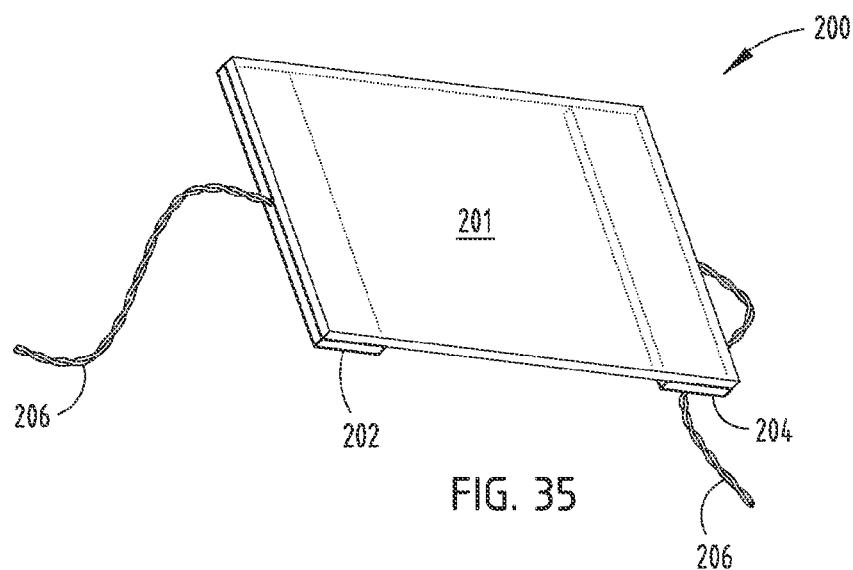
FIG. 35 is a top perspective view of one embodiment of a two-piezo-element clear protective cover.
Figure 36:
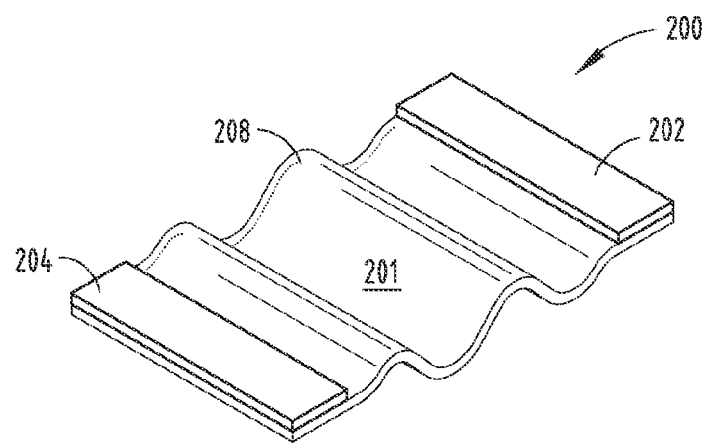
FIG. 36 is a top perspective view of the two-piezo-element clear protective cover of FIG. 35 during use.

As illustrated in the embodiment of FIGS. 35 and 36, an activated two-piezo-element clear protective cover assembly 200 is shown with a clear protective cover 201 and dual active transducers 202, 204. The two-piezo-element clear protective cover assembly 200 includes a first transducer 202 and a second transducer 204. Each of the first and second transducers 202, 204 has an electrical line 206 that relays power from a power source.

As shown in FIG. 36, the two-piezo-element clear protective cover assembly 200 can be activated to provide a resonance having relatively high mechanical action per electrical input. As illustrated, the resonant mode is a standing wave 208, such that the nodes and antinodes maintain a constant position. It is contemplated that the resonant mode for the two-piezo-element clear protective cover assembly 200 will be in the 30 to 35 kHz range. However, it is also contemplated that the resonant mode may be outside of this range and could have a range of 10 to 50 kHz. Additionally, the two-piezo-element clear protective cover assembly 200 may include a configuration optimal for pulsing, which reduces total power consumption and minimizes potential heating concerns. Pulsing can have the effect of eliminating potential dead zones in the two-piezo-element clear protective cover assembly 200 at a particular resonant mode in which no displacement occurs.

Figure 37:
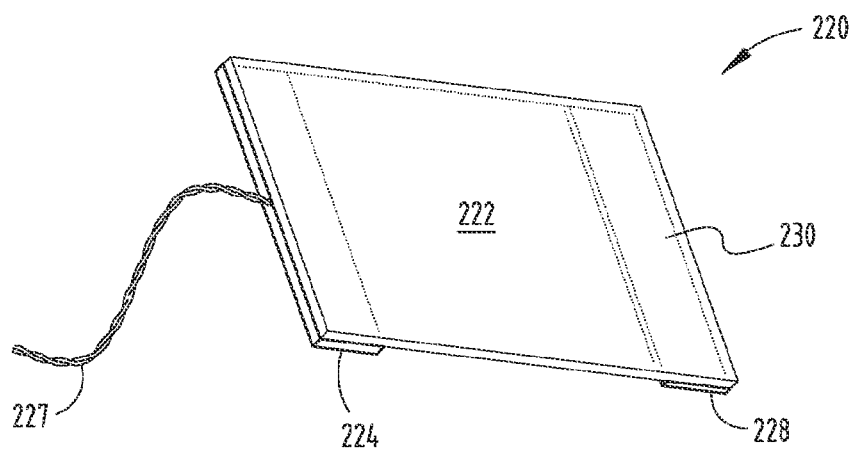
FIG. 37 is a top perspective view of one embodiment of a single-piezo-element clear protective cover.
Figures 38A, 38B:
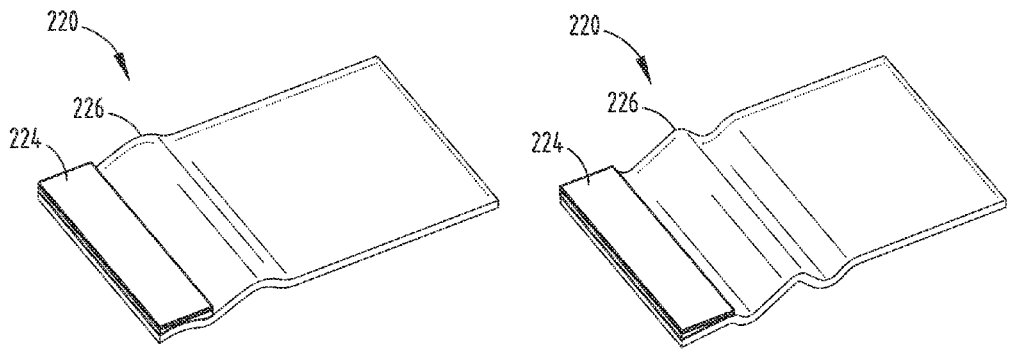
FIG. 38A is a top perspective view of the single-piezo-element clear protective cover of FIG. 37 after activation of a transducer.
FIG. 38B is a top perspective view of the single-piezo-element clear protective cover of FIG. 37 after activation of the transducer as a wave passes across the clear protective cover.
Figures 38C, 38D:
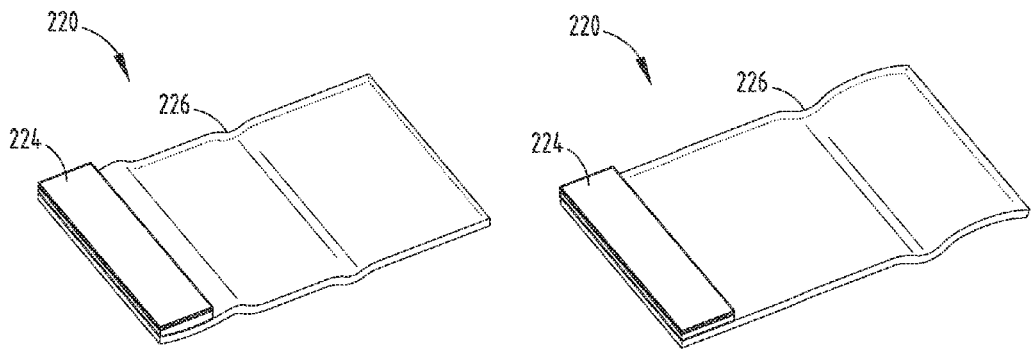
FIG. 38C is a top perspective view of the single-piezo-element clear protective cover of FIG. 37 after activation of the transducer as a wave passes across the clear protective cover.
FIG. 38D is a top perspective view of the single-piezo-element clear protective cover of FIG. 37 after activation of the transducer as a wave passes across the clear protective cover.

The illustrated embodiment of FIG. 37 includes a single element clear protective cover assembly 220 having a clear protective cover 222 and a single active transducer 224. This particular configuration is effective for emphasizing transverse-traveling transient waves 226. The single active transducer 224 receives power from an electrical line 227. As illustrated, the single active transducer 224 has the effect of creating a "whipping" motion that corresponds with waves formed by the single active transducer 224. The transient waves 226 will be most apparent in a frequency range of approximately 30 to 35 kHz, although it is contemplated that the transient waves 226 may extend outside this range.

Referring now to FIGS. 38A-38D, the single active transducer element loses some transverse displacement energy as the wave created by the single active transducer 224 extends longitudinally across the clear protective cover 222. Lost transverse displacement energy can be mitigated by adding a rubber absorber 228 on a distal end 230 of the clear protective cover 222. It is contemplated that this configuration will generally prevent longitudinal displacement without generating reflections causing a standing wave pattern. For both the dual active transducer construction and the single active transducer construction shown in FIGS. 35-38D above, it is contemplated that the transducers will not require more than 4 Watts of power to operate effectively.

Figure 39:
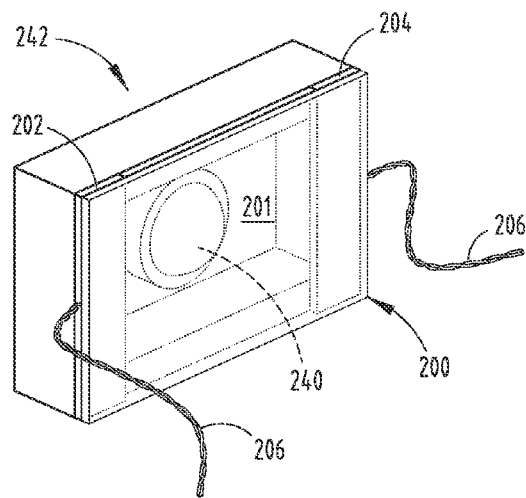
FIG. 39 is a top perspective view of one embodiment of a clear protective cover installed over a light sensor device.

Referring now to FIG. 39, a lens cleaning apparatus 242 of the present invention is illustrated, wherein a clear protective cover includes the two-piezo-element clear protective cover assembly 200, which can generate a resonance mode, to clean an external surface of the clear protective cover 201. In operation, when the clear protective cover 201 has become covered with dirt or debris, the first and second transducers 202, 204 connected with the clear protective cover 201 are activated, thereby creating a waveform across the clear protective cover 201. Consequently, dirt and debris are expelled from the external surface of the clear protective cover 201, thereby providing a clear viewing area through which a light sensor device 240 disposed behind the clear protective cover 201 may retrieve image data. It is contemplated that the clear protective cover 201 may be used in conjunction with any of the embodiments discussed herein and is not limited to only the embodiments associated with FIGS. 35-39.

Power

For all of the embodiments discussed herein, power can be supplied to the piezoelectric transducer by wires in a twisted pair configuration, coaxial, shielded cable, flex circuit, metal foil strips, laminations in a shielded configuration, or the like. The power connection to the piezoelectric transducer can be made by wire bonding, soldering, electrical welding, ultrasonic bonding, compression welding, crimping, conductive adhesive, mechanical compression, spring compression, or spring contact clips or connectors. Different power modes or levels and/or frequencies can be supplied to the piezoelectric transducer, and consequently the lens cover, to generate the different energy levels required to heat, flex, shake, vibrate, or atomize fluid on the lens cover. Multiple harmonic frequencies can be super imposed on the drive signal. The frequency can sweep around a resonance harmonic to account for mass changes due to water/dirt accumulation on the lens cover. It is contemplated that the power may be pulsed, at ignition, or at reverse. It is also contemplated that the power may activate upon direction by a rain sensor, a windshield wiper switch, a windshield washer switch, vision software/image quality software, and/or manually toggled by a user. If the power is pulsed at vehicle shutdown or power off, the light sensor device will clean itself before shutting down to avoid accumulated wet salt or sludge from drying on the lens while the vehicle is parked. In one mode, cleaning can be accomplished by stepping through a power sequence increasing power to the piezoelectric transducer to minimize cavitation damage (or until image is restored) to the lens or lens cover. It is desirable that the piezoelectric transducer be designed to function at a vibration frequency in a range undetectable to humans, or otherwise only minimally detectable by humans or animals. The sound range that can be detected by humans is generally from about 20 Hz to 15 KHz. It is generally desirable, although not necessary, that the frequency range be set outside the range of 20 Hz to 2 KHz and outside the range of 20 Hz to 18 kHz.

Figure 32:
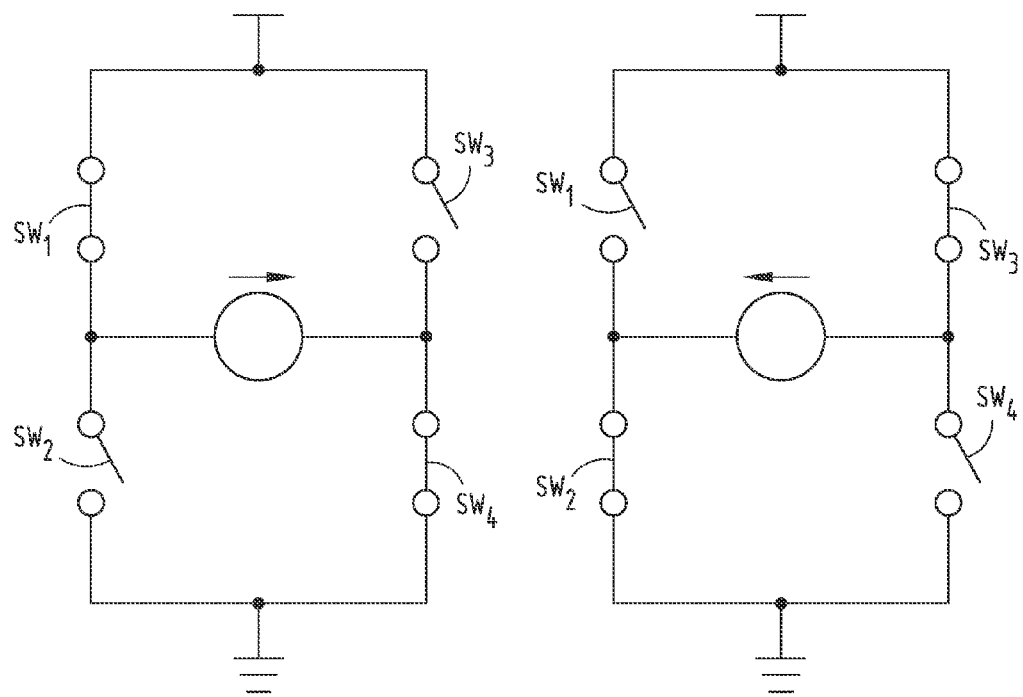
FIG. 32 is a schematic of an H-bridge circuit of the present invention.

Power can be supplied with an H-bridge integrated circuit (IC) (FIG. 32). The drive in an automotive application is switched or pulsed DC. The drive waveform can be approximately a full or half square wave, full or half sign wave, full or half triangular wave, or a combination of the above. In one embodiment of the present invention, the piezoelectric device 10 will include an H-bridge drive circuit, which will generally provide a drive signal that is approximately a square wave. An H-bridge (FIG. 32), as disclosed herein, is generally defined as an electronic circuit that allows a voltage to be applied across a load in a forward or rearward direction. These circuits are often used in robotics and other applications to allow DC motors to run forwards and backwards. It is contemplated that the H-bridge, as described herein, may be used as an IC or can be built from discrete components. The term "H-bridge" is derived from the graphical representation of such a circuit. The H-bridge is built with four switches (generally solid-state or mechanical). When the switches SW1 and SW4 are closed (and SW2 and SW3 are open) a positive voltage will be applied. By opening the SW1 and SW4 switches and closing the SW2 and SW3 switches, this voltage is reversed.

Figure 33:
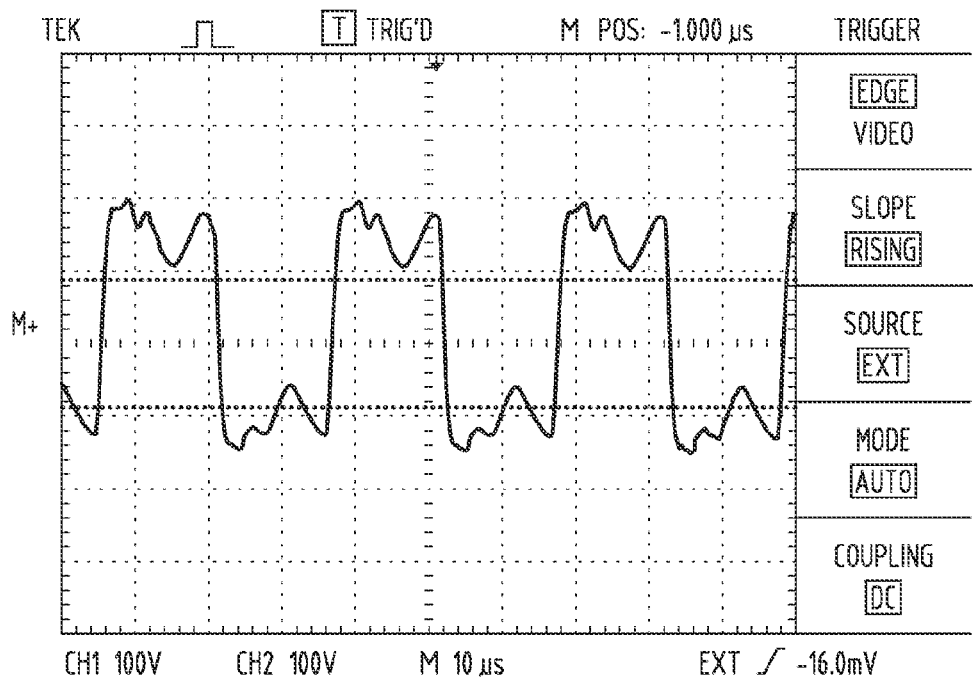
FIG. 33 is a graph of a waveform for a piezoelectric device of the present invention.
Figure 34:
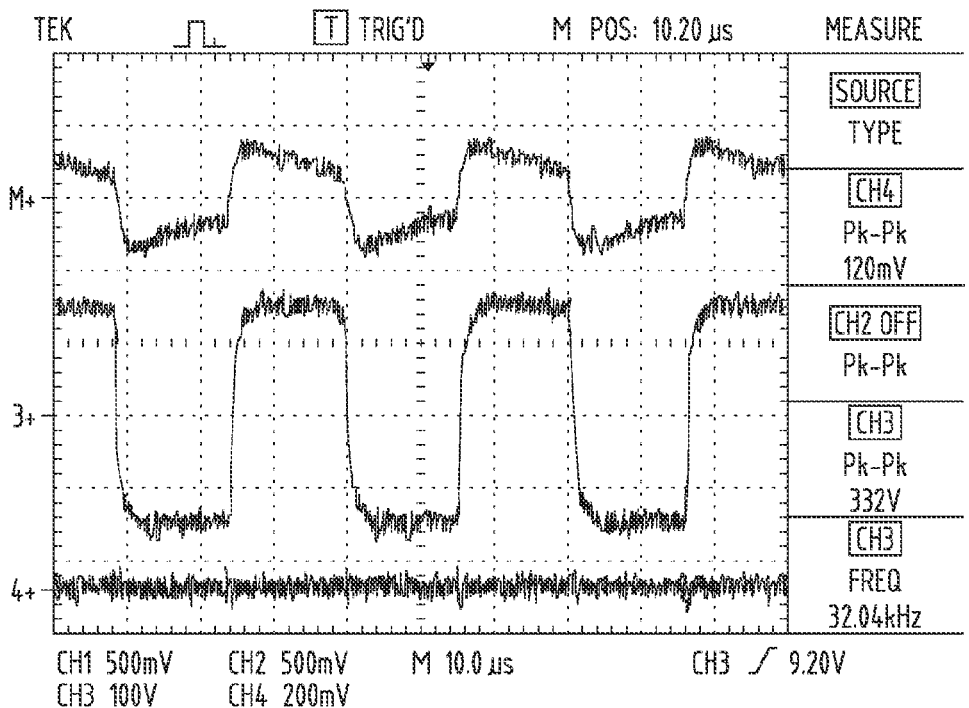
FIG. 34 is a graph of a waveform for a piezoelectric device of the present invention.

FIGS. 33 and 34 illustrate drive signals associated with the piezoelectric device 10, as disclosed herein. It is contemplated that the drive signal may have a fixed frequency or may sweep through one or more frequencies corresponding to system resonance. The top line of FIG. 34 illustrates some overshoot and then a slight decay before the next pulse. The bottom line of FIG. 34 illustrates very close to a square wave, which may occur if the impedance is not a high Q-value. The drive waveform can be approximately a full or half square wave, full or half sine wave, full or half triangular wave, or any combination thereof.

Heating Systems

In an exterior light sensor device application, such as on the vehicle 30, when light sensor device image quality is diminished by water, snow, ice, or frost, it is important to have a method to heat the exterior lens or lens cover. One possible method for heating is to use conductive coatings on the lens or lens cover and to make direct electrical contact to the coating or to electrodes on the coating. The conductive coatings may have anti-reflective properties, photocatalytic properties, or both. The heater needs to be designed so that the lens or lens cover will be warm enough to clear the external surface and yet not get so hot as to cause a potential burn to someone who might touch the external surface. Also, it is important to ensure that the heat does not cause an image problem or damage to the light sensor device 12 or the light sensor device housing 14. It is also not desirable to have the heater completely dry liquids on the outer lens or lens cover, which will result in a solid residue or water spot remaining on the lens or lens cover. It is desirable to melt snow or ice with the heater and then displace the liquid by piezoelectric device activation before the liquid dries.

Each of the embodiments disclosed herein are designed such that they can be used in combination with a piezoelectric systems that vibrate the lens covers. As discussed above, an anti-reflectance (AR) layer may be disposed on the lens cover or light sensor device lens. In one embodiment, the AR layer is designed to enable resistive heating of the lens cover through a conductive portion in the AR layer. This is accomplished by including a conductive layer, such as a transparent conductive oxide (TCO), to the AR stack design. One example of such a heatable AR stack is a V-coat AR stack. An AR stack might consist of 0.38 quarter waves (at 550 nm) of indium-tin oxide (ITO) coated on the glass surface, followed by 1.15 quarter waves of $SiO_2$ on top of the ITO. This coating stack would reduce the first surface reflectance of a glass lens from a native value of approximately 4.2 percent to an anti-reflected value of approximately 0.9 percent. A 1 mm glass lens, having two surfaces, would have a native reflectance of approximately 8 percent, which would be reduced to approximately 5 percent by a single AR layer and reduced to approximately 1.7 percent by AR coatings on both surfaces. Alternatively, surface heating could be accomplished without an AR layer by the addition of a TCO, such as a half-wave of ITO, to the front face 56 or the rear face 54 of the lens cover 20. The sheet resistance of the TCO can be controlled independently of its thickness both through choice of TCO material and control of the TCO's stoichiometry and crystallinity via deposition conditions. The control of sheet resistance allows matching of the required heating ($W/cm^2$) for the intended design goals for drive potential, ice melting, etc.

A heater for the light sensor device generally may also be utilized to minimize fluid, ice build-up, or condensation on the lens cover. The heater can be controlled by various methods. Control methods for a generally constant wattage heater are generally different than those associated with a positive thermal coefficient (PTC) heater. A constant wattage heater maintains a substantially constant resistance over the operating range of the heater while a PTC heater is designed so that the resistance of the heater rises rapidly over the desired temperature range, and therefore can be designed to be self-regulating.

For a constant wattage heater, the simplest form of control is to have the heater activated whenever the vehicle 30 is being operated. A user-activated on or off setting can also be used. The heater can be activated by a switch, can activate automatically, or may be on a timer to prevent overheating. Other methods for controlling the heater may include connecting the heater to the defrost cycle of the vehicle 30 or having the heater activate based on vehicle 30 input. Some possible inputs that could be useful in controlling the heater include exterior temperature, temperature of the light sensor device housing 14, temperature of the light sensor device 12, the light sensor device lens 38 temperature, lens barrel temperature, image quality, speed of the vehicle 30, humidity levels, or wiper motion. If the control system uses these types of inputs, it is possible to design a constant wattage heater to produce a fast initial ramp rate of 20 or 30° C./minute of the lens or light sensor device housing 14 and not risk light sensor device 12 temperatures that could cause image distortion or mechanical problems. The heater control could use an algorithm based on the inputs and heater design to ramp the system to the desired temperature and then maintain that temperature. To avoid the heater completely drying liquid on the lens cover, it is desirable to activate the piezoelectric device continuously or intermittently while the heater is on to displace liquid prior to complete evaporation to dryness to avoid water spots and solid residue accumulation on the lens/lens cover.

Control of a PTC heater is different from that of the constant wattage heater. A PTC heater can be designed to have fast initial heating and then level off quickly so that more complicated control systems may not be necessary. It is not uncommon for the resistance of a PTC heater to vary by a factor of 2 or 3 over a 10° C. range. Thus, over a 10° C. range, the wattage will decrease by a factor of 2 or 3.

Other heating methods for heating the lens cleaning apparatus (light sensor device, lenses, light sensor device housing, lens housing) include, but are not limited to, convection, conduction, induction, or radiation. Infrared light-emitting diodes (LEDs), for example, could be used to heat and could also be used to illuminate an area in front of the light sensor device 12 for better night vision. Since the area around the light sensor device 12 is sometimes crowded, the heat source may be disposed proximate the light sensor device 12. Heat generated by the heat source would be conveyed to the light sensor device 12 via conduction or convection. The heat could also be generated by the piezoelectric device itself. Operation of the piezoelectric device will generate heat and operation of the piezoelectric device alone may be sufficient to melt snow and ice and remove condensation.

If the light sensor device 12 includes multiple lenses, the ability of the light sensor device 12 to focus and the quality of the image are influenced by the positions of the lenses relative to each other and to the light sensor device 12, as well as other optical properties related to the lens materials, such as an Abbe number. The temperature of the light sensor device 12, lens cover 20, and housing 14 can have a significant impact on the image quality. Expansion and contraction of the materials used to construct the light sensor device 12 may cause the distance between the lens and the distance from the lens to the light sensor device 12 to change. This positional change will cause a change in the ability of the light sensor device 12 to focus. Furthermore, the dispersive properties of optical materials are a function of environmental conditions, such as temperature. If the light sensor device 12 is designed and optimized at a given temperature, any temperature, whether higher or lower, will degrade the image quality. A larger change in temperature will produce a larger degradation in image quality. It is contemplated that the heater used to heat any portion of the light sensor device 12 will improve the image quality if the heater can raise the light sensor device 12 temperature from a temperature lower than the design temperature to an elevated temperature closer to the temperature at which the light sensor device 12 was designed and optimized. It should be noted that if the heater drives the temperatures above the design temperature, image quality may lessen. A temperature sensor can be used to monitor the light sensor device 12 temperature and use that input to adjust the heater, as needed, in an attempt to keep the light sensor device 12 closer to the design temperature. Further, if the light sensor device housing 14 was equipped with a mechanical venting system, air flow could be used to reduce the light sensor device 12 temperature, thus cooling the light sensor device 12. If a temperature sensor detected that the light sensor devices 12 was above its design temperature, the mechanical venting system could be opened to allow increased air flow around the light sensor device 12.

Alternatively, maintaining the design temperature on hot sunny days could be achieved by designing the light sensor device for a high temperature situation and then using a heater to adjust the temperature up to that temperature when needed.

For example, if the light sensor device system was optimized for 30° C.-35° C., a temperature sensor and heater system could be used to maintain that temperature whenever the vehicle 30 is in use.

As an example, a piezoelectric device can be useful in removing water droplets from the surface of a piece of glass, such as a lens or lens cover. It is desirable to sweep the frequency of the piezoelectric device to ensure that the resonance frequency is achieved for various droplet sizes. Although this system may to be most active in the audible range, using an audible piezoelectric device to keep a vehicle camera system clean may prove to be loud or annoying. Using a system that runs outside the audible frequency range for humans or animals is generally desired, but not necessary. Sweeping through a wide range of frequencies is beneficial in that different size droplets and materials other than water will have different resonance frequencies. Sweeping the frequency provides a wide range of possible resonance frequencies. In one embodiment, the piezoelectric device is operated at around 100 VAC at a frequency of 20 MHz. The piezoelectric device becomes very hot, and between the heat and the mechanical energy, water is atomized quickly from the surface of the lens cover that is coupled with the transducer.

As another example, a piezoelectric buzzer may be run at a potential of 20 volts and with a sine wave of approximately 3.4 kHz. Water droplets placed directly on the piezoelectric transducer are atomized when the piezoelectric transducer is powered. The frequency can be set to sweep from 3.1 kHz to 3.6 kHz such that water is atomized off of the lens cover coupled with the piezoelectric transducer. Epoxy may be used to attach a 1 inch diameter circle of glass that is approximately 0.5 mm thick to the piezoelectric transducer. With the glass attached, water may be best removed at around 7.3 kHz. Again, a sweep of frequencies may be used from 7.1 to 7.7 kHz to easily remove different size water droplets. Large water droplets are generally removed readily at around 7.3 kHz, but smaller droplets are generally not removed as efficiently at this frequency. A large range of frequencies may be explored from 0.1 Hz up to the 100 MHz range. Sine waves, square waves, and pulses may be used. Sweeping through the 1-30 kHz range in a repeating cycle of 1 to 2 seconds is effective at removing a wide range of droplet sizes. The 7.3 kHz range may be very active, depending on the size of the piezoelectric transducer. A coating of Aquapel™ (PPG) may be added to the glass surface to cause the surface to become hydrophobic, and the contact angle of the water droplets on the glass substrate will generally increase. The addition of the hydrophobic coating produced a noticeable enhancement in water removal from the glass surface.

It is also contemplated that a piezoelectric device can be used that not only provides vibrational energy, but also provides heat to the surface of the device to remove water or ice. In this example, water is applied directly to the surface of the piezoelectric device. A similar effect can be envisioned with the device thermally and vibrationally coupled to a lens, lens body, or lens cover.

In another example, a higher wattage heater may be used to achieve the desired temperature more quickly. This is important if the light sensor device image is needed shortly after the vehicle is started. A high wattage heater could be driven at full wattage when the control system determines that heating is needed, and with input from the system using temperature feedback or other information from the vehicle 30, average power could be reduced to the heater to maintain a temperature near the design temperature for the optics. For rapid heating, the lens cover 20 can be made thin and connected with a heater having a high watt density rating. In one example, a heater was used to heat a 1.1 mm thick piece of glass. The following table shows the results.

The measurements below represent a lens cover glued around the perimeter to a housing with a heater laminated to a second surface of the 1.1 mm glass. For each test, the glass started out at approximately 24° C. Potential was applied and a first surface glass temperature was measured. The same part was measured four times at different power densities. The measurements are illustrated below. The time from unlocking a door of a vehicle to the time the vehicle is placed in reverse may be very short. High watt densities are important to heat the glass lens cover as quickly as possible before the camera is needed. A watt density of at least 200 mW/cm² performs well in typical environmental conditions. In colder environments, a watt density of 300 mW/cm² performs well.

| TIME (Seconds) | 180 mW/cm² | 269 mW/cm² | 359 mW/cm² | 499 mW/cm² |
| --- | --- | --- | --- | --- |
| 30 | 34.3 C. | 36.1 C. | 36.4 C. | 40.3 C. |
| 60 | 38.3 C. | 42.4 C. | 44.6 C. | 51.1 C. |
| 90 | 42.2 C. | 47.2 C. | 52.2 C. | 57.4 C. |
| 120 | 44.7 C. | 52.6 C. | 57.1 C. | 69.3 C. |
| 150 | 46.0 C. | 54.9 C. | 60.7 C. | 71.5 C. |
| 180 | 47.5 C. | 56.2 C. | 62.8 C. | 73.9 C. |

Controlling different portions of the light sensor device separately is beneficial, particularly if the hot electronic components are heating some areas of the light sensor device more than other areas. Also, since it is likely that some areas of the light sensor device will have greater thermal mass than other areas, it may be beneficial to have either one heater with variable watt densities or more than one heater located in the light sensor device. Additionally, a heater can be placed near the light sensor device or may be attached directly to the light sensor device. For the fastest temperature rise in the light sensor device lens barrel or light sensor device, making good thermal contact between the heater and the light sensor device is important.

When a separate heater is used for the light sensor device, the temperature inputs can be used to keep the light sensor device at a similar temperature to the lens barrel. Regardless of the light sensor device design, it is important to control the distance between the lenses. Thus, multiple heaters or multiple watt densities within the heater may be desirable.

As an example, a camera heater may be assembled using approximately 22 feet of coated 40 AWG wire. The wire is wrapped around the barrel containing the camera lens. The camera body is constructed from aluminum and has dimensions of approximately 22×22×26 mm with a lens barrel approximately 15 mm in diameter and 10 mm long. The outermost 6.5 mm of the barrel is a separate piece from the main body of the camera and attached by threads.

It is generally contemplated that a heater having an overall resistance of approximately 22 ohms may be used, and when powered at 5 Volts, may provide approximately 1.1 Watts of heat. Using a Fluke Ti55 thermal imager, and applying 5 VDC, at equilibrium, the outermost lens barrel can reach a temperature of approximately 44° C., while the actual glass lens may reach a temperature of 40° C. The camera housing may only reach approximately 37° C. The change from 44° C. to 37° C. may be an abrupt jump right at step from the outer barrel to the rest of the camera body. During a temperature ramp, such as described in this example, the lens temperature will likely only be 30° C. after one minute of heating, and should not reach 40° C. until the $5^{th}$ minute of heating.

In another example, a second resistive heater can be added to the system by wrapping approximately 15 feet of coated 40 AWG wire around the camera body. The resistance of this second heater may be approximately 15 ohms. A camera may be placed in a freezer and allowed to reach a temperature of −13.5 C. A potential of 12 VDC can then be applied to the lens barrel and a potential of 17.3 VDC may be applied to the camera body. Temperature readings recorded every 10 seconds until the temperature reading is near 30° C. should be similar to those shown below.

| Time (seconds) | Temperature - Lens Barrel (C.) | Temperature - Camera Body (C.) |
|---|---|---|
| 0 | −13.5 | −13.5 |
| 10 | −2.8 | −7.7 |
| 20 | 5.6 | 0.2 |
| 30 | 14.0 | 6.5 |
| 40 | 20.4 | 11.9 |
| 50 | 26.0 | 16.0 |
| 60 | 29.7 | 19.8 |
| 70 | | 23.8 |
| 80 | | 27.0 |
| 90 | | 30.7 |

In yet another example, a coated lens cover may be made using $TiO_2$ and ITO coatings on a piece of 2.2 mm thick float glass approximately 22×18 mm. The sheet resistance of the coating will be approximately 60 ohms. Contact can be made to the coating using metal clips along the short sides of the glass. The resistance between the clips can measure approximately 102 ohms. At 10 VDC the uncoated glass surface may ramp up from room temperature to 38° C. after 30 seconds, 44° C. after one minute, 53° C. after 2 minutes, and eventually stabilize at around 62° C. The lens cover 20 may also be heated using a separate heater that is not integral to the piezoelectric device 10. To increase the likelihood of defrosting of the lens cover 20 as quickly as possible, the heater control may be activated when the vehicle doors are unlocked, such as by a traditional key fob.

In still another example, a piezoelectric device can be used to remove water droplets from the surface of a piece of glass, such as a lens or lens cover. The frequency of the piezoelectric device is swept across a variety of ranges to ensure that ideal resonance frequency is achieved for various droplet sizes. Designing the piezoelectric transducer attached to the lens or lens cover to remove water at frequencies above audible levels may be important to prevent annoying noises in the vehicle.

Alternative Lens Cleaning Devices

In addition to piezoelectric actuators, it is also contemplated that other methods can be used to shake the lens cover, including by way of an electromagnetic voice coil assembly in which a wire coil is suspended around a permanent ring magnet. Applying electrical current to the wire coil causes the wire coil to move. A lens cover is coupled to the voice coil. Movement of the lens cover can be configured in various ways.

Figure 40A:
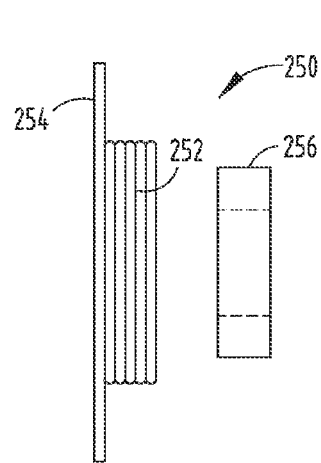
FIG. 40A is a side elevational view of one embodiment of a voice coil assembly of the present invention.
Figure 40B:
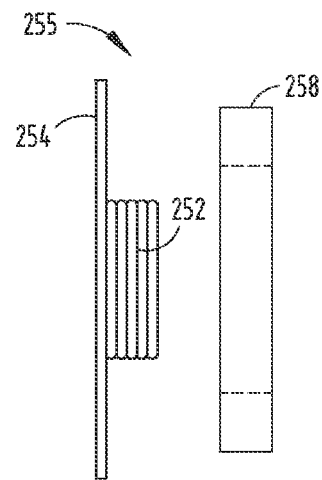
FIG. 40B is a side elevational view of the voice coil assembly of FIG. 40A.

As illustrated in the embodiment of FIG. 40A, a voice coil assembly 250 includes a voice coil 252 attached to a lens cover 254. A ring magnet 256 is disposed adjacent an inside circumference of the voice coil 252. The voice coil assembly 250 is attached with a compliant mount 260 (FIG. 41) that allows a limited range of movement. The ring magnet 256, however, is fixedly coupled to a vehicle. Applying a varying current to the voice coil 252 causes the lens cover 254 to vibrate. In the embodiment illustrated in FIG. 40B, a voice coil assembly 255 includes a large ring magnet 258 that extends around the voice coil 252. The voice coil 252 includes an outer diameter that is sized to fit inside the large ring magnet 258.

Figure 41:
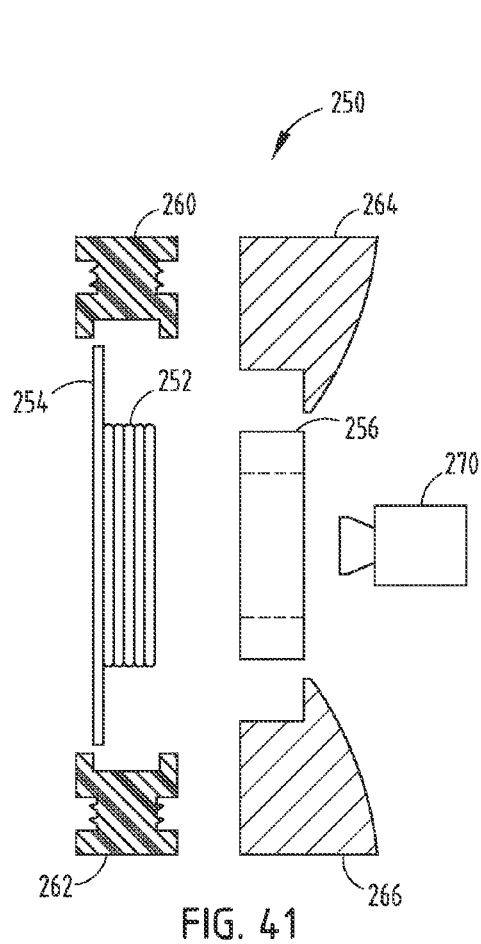
FIG. 41 is a side elevational cross-sectional view of another embodiment of a voice coil assembly of the present invention.

As illustrated in the embodiment of FIG. 41, the voice coil assembly 250 is designed for coupling with compliant mounts 260, 262. Fixed mounts 264, 266 fixedly attach the ring magnet 256 to the vehicle. A light sensing device 270 is disposed behind the lens cover 254, and therefore is protected from environmental conditions.

Figure 42A:
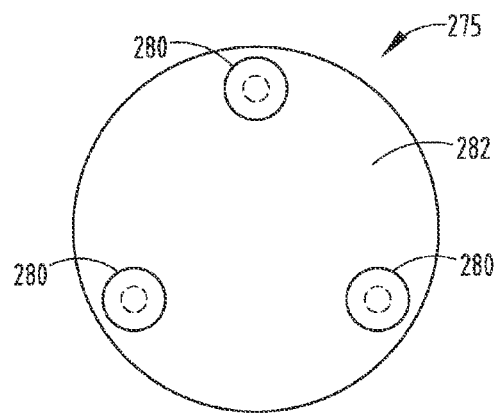
FIG. 42A is a rear elevational view of a multi-voice coil assembly of the present invention.
Figure 42B:
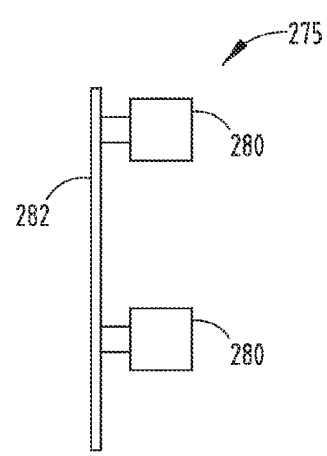
FIG. 42B is a side elevational view of the multi-voice coil assembly of FIG. 42A.

Various other coil and magnet configurations are also contemplated, such as those illustrated in FIGS. 42A and 42B, in which a multi-voice coil assembly 275 uses one or more electromagnets and one or more permanent magnets are arranged as voice coils or solenoid actuators 280. The actuators 280 are then positioned about a lens cover 282 in a predetermined configuration that allows the lens cover 282 to move in more than one axis. The lens cover 282 moves in more than one axis because the actuators 280 are driven with specific signals.

Figure 43:
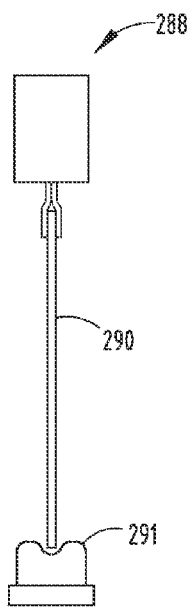
FIG. 43 is a side elevational view of a lens cover assembly of the present invention.

In another embodiment, as illustrated in FIG. 43, a lens cover assembly 288 has a lens cover 290, which is moved in vertical or horizontal planes at right angles to an adjacent light sensing device. Specifically, moving the lens cover 290 in the vertical plane works with the force of gravity to cause droplets of water to run down the external surface of the lens cover 290. A compliant mount 291 is disposed below the lens cover 290.

Figure 44:
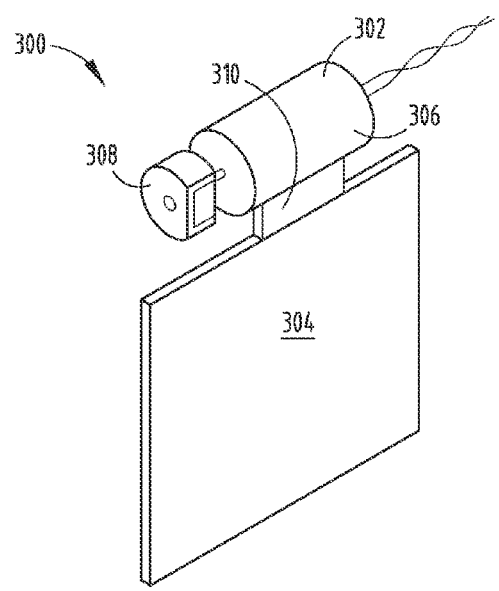
FIG. 44 is a top perspective view of a vibratory assembly of the present invention.

In another embodiment, as illustrated in FIG. 44, a vibratory assembly 300 includes a common vibration motor 302 coupled to a lens cover 304. Vibration motors 302, such as those utilized in known mobile communications are frequently used in cellular phones and pagers to provide silent alarms to the user. Vibration motors 302 generally include a small electric motor 306 and an offset counterweight 308. A compliant mount, or other suitable attachment structure, for coupling the vibration motor 302 to the lens cover 304 may be utilized.

Figure 45:
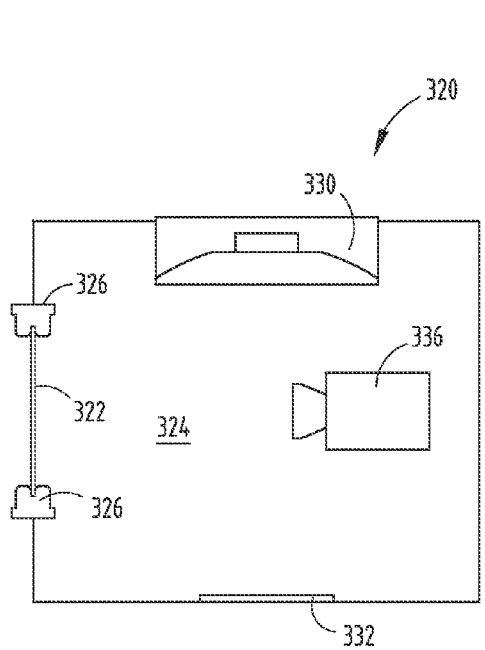
FIG. 45 is a side elevational cross-sectional view of another embodiment of a vibratory assembly of the present invention.

Another embodiment of a vibratory assembly 320 is illustrated in FIG. 45. The vibratory assembly 320 includes a lens cover 322 made to vibrate by changes in air pressure inside a sealed enclosure 324 of the vibratory assembly 320. The lens cover 322 is connected with compliant mounts 326, 328. An audio speaker device 330 is coupled to the sealed enclosure 324. In this embodiment, the back side of the audio speaker device 330 is ported to the outside, while the front side is sealed inside the enclosure 324. When the audio speaker device 330 vibrates, the air pressure in the sealed enclosure 324 rises and falls, thereby causing the lens cover 322 to vibrate. An air permeable vent 332 allows the sealed enclosure 324 to adjust to changes in atmospheric pressure, but is effectively sealed with respect to the higher speed air changes of the transducer. A light sensor device 336 is located inside the sealed enclosure 324.

Figure 46:
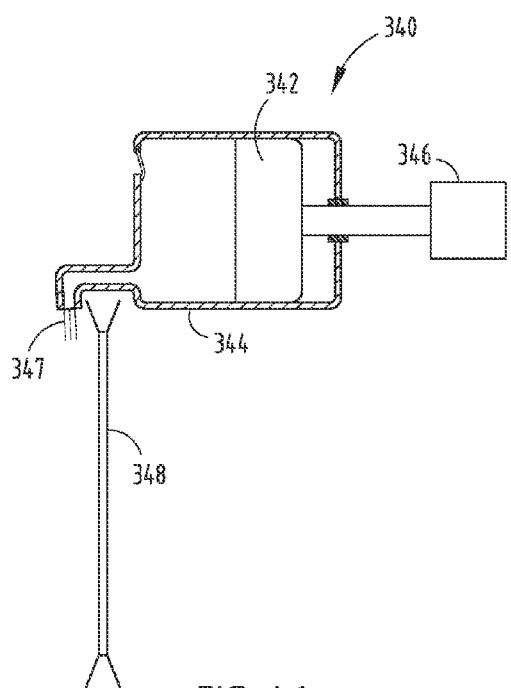
FIG. 46 is a side elevational cross-sectional view of one embodiment of a debris-removing air system of the present invention.

Alternatively, a fluid lens cleaning device may be implemented that uses a gas or a liquid to clean a lens cover. As illustrated in FIG. 46, a fluid lens cleaning device 340 that uses gas as a cleaning medium includes a plunger 342 disposed within a cylinder 344. The plunger 342 is driven by an actuator 346 of any suitable design. When the plunger 342 is retracted, air is drawn into the cylinder 344 from the exterior. Extending the actuator 346 rapidly forward then causes a quick puff of air 347 to be forced across a lens cover 348. It is contemplated that the air system 340 may include a device for biasing the plunger 342 for sudden release. For example, a worm gear could be used to allow a motor to operate for a period of time to energize the spring, thereby 'charging' the plunger 342 for sudden release. Other suitable constructions for biasing a plunger may be utilized, including employing a motor and gear train for energizing the spring in one rotational direction, and suddenly releasing it in the other.

Another example of a fluid lens cleaning device includes an air valve supplied by compressed air may be used to periodically blow off the lens cover. The air compressor may be contained within the camera assembly, or may be part of an existing vehicle system, such as an air suspension system. If contained in the camera assembly, it may be desirable to include a reservoir that is filled over a period of time by a small compressor, so as to achieve a higher pressure that may be suddenly vented. Various valve designs are known to those skilled in the art which require a small actuator for quickly controlling a large amount of air. For example, one such device is a diaphragm piloted valve.

Figure 47:
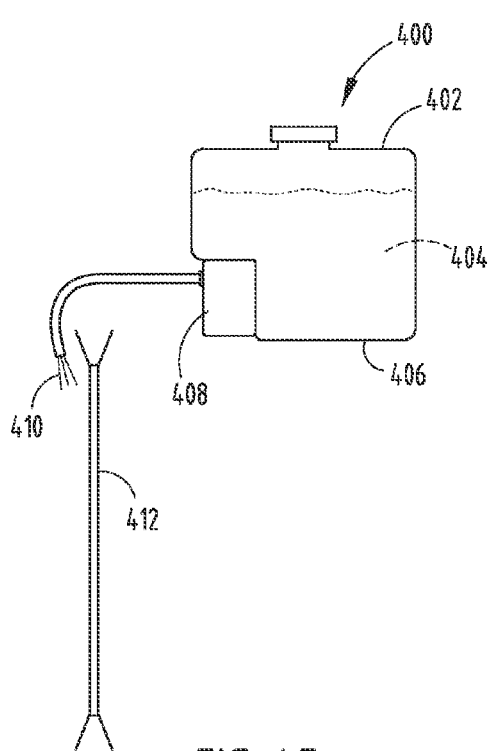
FIG. 47 is a side elevational view of one embodiment of a debris-removing liquid system.

Referring now to the embodiment generally illustrated in FIG. 47, another embodiment of a fluid lens cleaning device 400 includes a reservoir 402 adapted to hold a cleaning fluid 404 therein. The reservoir 402 includes a base 406 adapted for secure engagement on a vehicle. The lens cleaning device 400 includes a motorized system that incorporates a pump to distribute a liquid 410 through a hose and onto a lens cover 412. It is generally contemplated that the cleaning fluid 404 may be windshield wiper fluid supplied from a forward portion of the vehicle 30, or any other cleaning fluid as generally known in the art. Additionally, it is contemplated that the consumer may be able to adjust a cap on a top portion of the lens cleaning device 400 to provide additional cleaning fluid 404 to the reservoir 402, if necessary.

Figure 48:
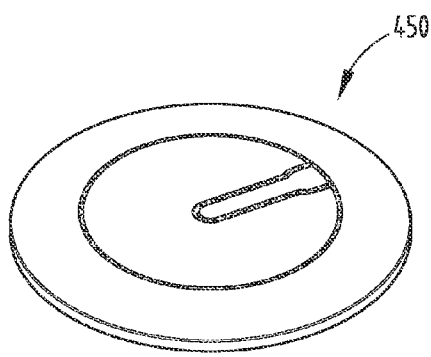
FIG. 48 is a top perspective view of one embodiment of a feedback mechanism for a piezoelectric device of the present invention.
Figure 49:
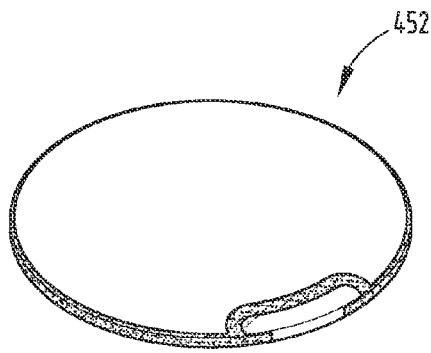
FIG. 49 is a top perspective view of another embodiment of a feedback mechanism for a piezoelectric device of the present invention.
Figure 50:
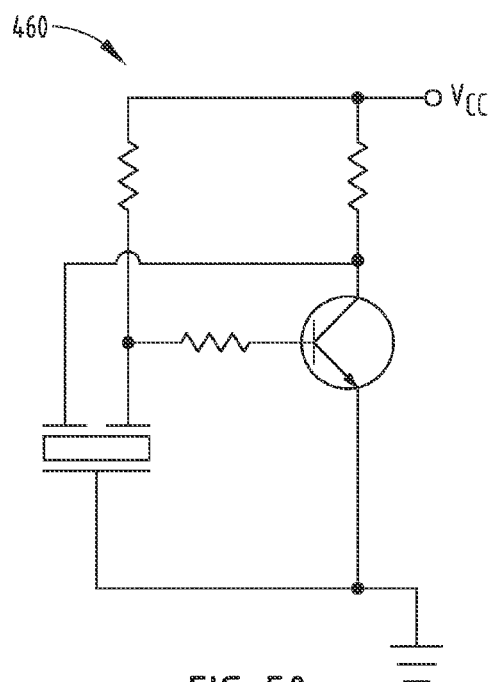
FIG. 50 is a schematic view of one embodiment of a piezoelectric drive circuit of the present invention.

In another embodiment, a piezoelectric drive may be utilized that incorporates feedback mechanisms 450, 452 generally illustrated in FIGS. 48 and 49, respectively, in order to drive the piezoelectric device 10 at a natural resonant point. The resonant point may vary with temperature and the amount of water or debris disposed on the lens cover 20. Further, there may be significant part-to-part variations of the natural resonant point based upon installation and mounting materials that are utilized during the manufacturing process, as well as various manufacturing techniques used to apply those materials. Resonance will also give the highest deflection for the piezoelectric transducer 16. In one embodiment, the natural resonance is achieved by segmenting a drive conductor on the piezoelectric device 10 into a large drive area, and a smaller electrically isolated sensor area. The small sensor area receives a drive amplifier as a feedback signal. If desired, a circuit 460 (FIG. 50) may be used that allows both resonant and variable frequency drive arrangements. Alternatively, a separate piezoelectric device 10 may be attached to a surface of the lens cover 20 to detect the amount of motion and to subsequently provide feedback to the piezoelectric drive circuit.

In yet another embodiment, segregated electrodes may be provided on the same piezoelectric transducer 16 to provide feedback. More specifically, inner and outer electrodes arranged on an inside wall and an outside wall of the piezoelectric device 10 may drive the piezoelectric device 10, while electrodes disposed on the top and bottom walls of the piezoelectric device 10 provide feedback on vibrational activity. Mechanical stresses on the material of the piezoelectric device 10 generate voltage that can be sensed by conductors. The generated voltages can be used to drive the feedback signal to the amplifier.

The feedback circuit may take on a variety of constructions. For example, the feedback circuit may be configured to adjust the drive frequency, such that the drive frequency may be kept at the resonance frequency (maximum vibrational activity), regardless of mass changes. In one instance, the piezoelectric device 10 may be configured to continuously sweep through a given frequency range around the resonance frequency.

It will be understood that the lens cover cleaning apparatuses disclosed herein can also be used in conjunction with mechanical cleaning systems, such as those disclosed in U.S. Provisional Patent Application No. 61/551,749, entitled "IMAGING DEVICE PROTECTOR AND CLEANER," which is hereby incorporated herein by reference in its entirety.

It will also be understood for each of the aforementioned embodiments illustrated in FIGS. 1-50 that other constructions could also be utilized. It will also be understood that features of every embodiment disclosed herein may be used in conjunction with other embodiments disclosed herein or incorporated by reference and not specifically discussed. The disclosed embodiments are to be construed as examples and are not to be construed as limiting.

It will be understood by one having ordinary skill in the art that construction of the described invention and other components is not limited to any specific material. Other exemplary embodiments of the invention disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the invention as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combination's. Accordingly, all such modifications are intended to be included within the scope of the present innovations. Other substitutions, modifications, changes, and omissions may be made in the design, operating conditions, and arrangement of the desired embodiment and other exemplary embodiments without departing from the spirit of the present innovations.

It will be understood that any described processes or steps within described processes may be combined with other disclosed processes or steps to form structures within the scope of the present invention. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

What is claimed is:

1. A vibratory assembly comprising:
    a housing;
    a transducer assembly located about an end of the housing and having a substantially cylindrical shape;
    an isolator at least partially disposed between the housing and the transducer assembly;
    a lens cover operably coupled with the transducer assembly, the lens cover including an arcuate viewing pane and a generally planar rim circumscribing the arcuate viewing pane;
    a power source having contacts operably coupled with the transducer assembly, wherein the power source is configured to supply power to the transducer assembly at various frequencies swept around a resonance harmonic to vibrate the transducer assembly and consequently the lens cover through a range of frequencies to account for mass changes resulting from debris accumulation on the lens cover; and
    an anti-reflectance coating disposed on a forward face of the lens cover, wherein the anti-reflectance coating is at least partially conductive such that a current can be passed through the coating to heat the forward face of the lens cover.

2. The vibratory assembly of claim 1, further comprising:
    a barrier member disposed between the transducer assembly and the lens cover.

3. The vibratory assembly of claim 1, further comprising:
    a hydrophobic surface treatment disposed on a front face of the lens cover.

4. The vibratory assembly of claim 1, wherein a diamond-like carbon is applied to an external surface of the lens cover.

5. The vibratory assembly of claim 1, wherein the lens cover is substantially planar.

6. A light sensing assembly for use on a vehicle comprising:
    a light sensor device;
    a housing disposed over the light sensor device, the housing having a forward opening;
    a lens cover disposed proximate the forward opening and including electrical heating contacts on a forward surface thereof;
    an anti-reflectance coating disposed on a forward face of the lens cover, wherein the anti-reflectance coating is at least partially conductive;
    a piezoelectric transducer operably coupled to the lens cover;
    an isolator disposed between the housing and the piezoelectric transducer wherein the piezoelectric transducer and isolator each include an annular configuration;
    a pulsing power source in electrical communication with the piezoelectric transducer and the lens cover, wherein the piezoelectric transducer is adapted to vibrate upon actuation of the pulsing power source, and wherein the pulsing power source is configured to supply an electrical power to the lens cover to heat the lens cover and the anti-reflectance coating; and
    a fluid lens cleaning device that is proximate the lens cover and that forces a stream of fluid over the lens cover.

7. The light sensing assembly of claim 6, wherein the lens cover is formed from a chemically strengthened glass.

8. The light sensing assembly of claim 6, wherein an external face of the lens cover includes a hydrophobic coating, and wherein a hydrophobic coating replenishing device is disposed proximate the lens cover.

9. The light sensing assembly of claim 6, wherein an internal face of the lens cover includes one of a porous $SiO_2$ coating and an organic film coating.

10. The light sensing assembly of claim 6, wherein the transducer is operably coupled with an h-bridge electronic circuit.

11. The light sensing assembly of claim 6, wherein the lens cover is substantially rectangular and wherein the transducer includes opposing active members on opposing sides of the lens cover.

12. The light sensing assembly of claim 6, wherein the power source is configured to supply electrical power at a frequency that is swept around a resonance harmonic to account for mass changes resulting from debris accumulation on the lens cover.

13. The light sensing assembly of claim 6, wherein the fluid lens cleaning device includes a plunger and cylinder assembly that forces a puff of air through a constricted aperture over the lens cover.

14. A housing for a light sensor device comprising:
    a wall structure defining a receiving cavity and a forward opening;
    a lens cover disposed over the forward opening of the wall structure;
    an anti-reflectance coating disposed on a forward face of the lens cover, wherein the anti-reflectance coating is at least partially conductive;
    a vibratory assembly including a plurality of arcuate transducers equidistantly spaced about a peripheral edge of the lens cover, wherein the vibrating assembly vibrates through a range of frequencies to remove various forms of debris from the lens cover;
    an isolator disposed between the vibratory assembly and the housing; and
    a heater operably coupled to the lens cover and configured to heat the lens cover and the anti-reflectance coating.

15. The housing of claim 14, wherein the vibratory assembly includes at least three arcuate transducers.

16. The housing of claim 14, further comprising:
    electrical heating contacts operably coupled to an exposed surface of the lens cover.

17. The housing of claim 14, further comprising:
    an anti-reflectance coating disposed on a forward face of the lens cover.

* * * * *

UNITED STATES PATENT AND TRADEMARK OFFICE
CERTIFICATE OF CORRECTION

Page 1 of 1

PATENT NO. : 8,899,761 B2
APPLICATION NO. : 13/428799
DATED : December 2, 2014
INVENTOR(S) : Tonar et al.

It is certified that error appears in the above-identified patent and that said Letters Patent is hereby corrected as shown below:

In the Specification

Col. 1, line 7;

"No." should be --Nos.--.

Col. 4, line 64;

"16" should be --1B--.

Col. 5, line 62;

"pot" should be --not--.

Signed and Sealed this
Thirtieth Day of June, 2015

Michelle K. Lee
*Director of the United States Patent and Trademark Office*